(12) United States Patent
Saito et al.

(10) Patent No.: US 6,371,276 B2
(45) Date of Patent: Apr. 16, 2002

(54) METHOD AND APPARATUS FOR SUPPLYING CHIP PARTS

(75) Inventors: Koji Saito; Kikuji Fukai; Taro Yasuda, all of Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/859,477

(22) Filed: May 18, 2001

Related U.S. Application Data

(63) Continuation of application No. 09/553,178, filed on Apr. 20, 2000, now Pat. No. 6,250,455.

(30) Foreign Application Priority Data

May 18, 1994 (JP) .............................................. 6-104108

(51) Int. Cl.⁷ .............................................. B65G 47/14
(52) U.S. Cl. ...................................................... 198/396
(58) Field of Search .............................. 198/396, 459.1, 198/459.6, 530, 531, 532, 401.2, 459.7

(56) References Cited

U.S. PATENT DOCUMENTS

| | | | |
|---|---|---|---|
| 2,828,888 A | 4/1958 | Nicolle | 198/396 X |
| 4,201,313 A | 5/1980 | Kirsch | 198/396 X |
| 4,355,712 A | 10/1982 | Bruno | 198/459.6 |
| 4,469,709 A | 9/1984 | Shrauf | 198/396 X |
| 4,607,744 A | 8/1986 | Pak | 198/461.2 |
| 4,650,060 A | 3/1987 | Storimans | 198/459.7 |
| 4,700,753 A | 10/1987 | Storimans | |
| 4,744,455 A | 5/1988 | Dragotta et al. | 198/396 X |
| 4,825,995 A | 5/1989 | Nalbach | 198/396 X |
| 4,945,976 A | 8/1990 | Rotola | 198/454.5 |
| 5,035,316 A | 7/1991 | Loates et al. | 198/459.1 |
| 5,167,316 A | 12/1992 | Kaminski | 198/468.4 X |
| 5,236,076 A | 8/1993 | Sung | 198/531 X |
| 5,423,410 A | 6/1995 | Keller et al. | 198/438 X |
| 5,494,149 A | 2/1996 | Sillner | 198/471.1 |
| 5,503,299 A | 4/1996 | Smith | |
| 5,636,725 A | 6/1997 | Saito et al. | 198/396 |
| 5,826,696 A | 10/1998 | Rupp et al. | 198/396 X |
| 5,836,437 A | 11/1998 | Saito et al. | 198/396 |

FOREIGN PATENT DOCUMENTS

| | | | |
|---|---|---|---|
| DE | 3921392 | 1/1991 | 198/396 |
| FR | 1483985 | 6/1967 | 198/459.6 |
| JP | 0112242 | 7/1982 | 198/383 |
| JP | 61-295914 | 12/1986 | 198/459.6 |
| JP | 62-175320 | 8/1987 | 198/459.6 |
| JP | 62-175321 | 8/1987 | 198/459.7 |
| JP | 62-244815 | 10/1987 | 198/459.7 |
| SU | 1340977 | 9/1987 | 198/396 |

*Primary Examiner*—James R. Bidwell
(74) *Attorney, Agent, or Firm*—Lowe Hauptman Gilman & Berner, LLP

(57) ABSTRACT

A chip component supplying apparatus is disclosed. The chip component supplying apparatus includes a storage chamber for storing chip components in random directions. A discharge channel allows the chip components in the storage chamber to move downward in a predetermined direction. A conveying channel conveys the chip components discharged from the discharge channel and wherein the discharge channel has an inclined portion at a lower part thereof and the chip components in the discharge channel are discharged to the conveying channel through the inclined portion.

16 Claims, 22 Drawing Sheets

F I G. 10
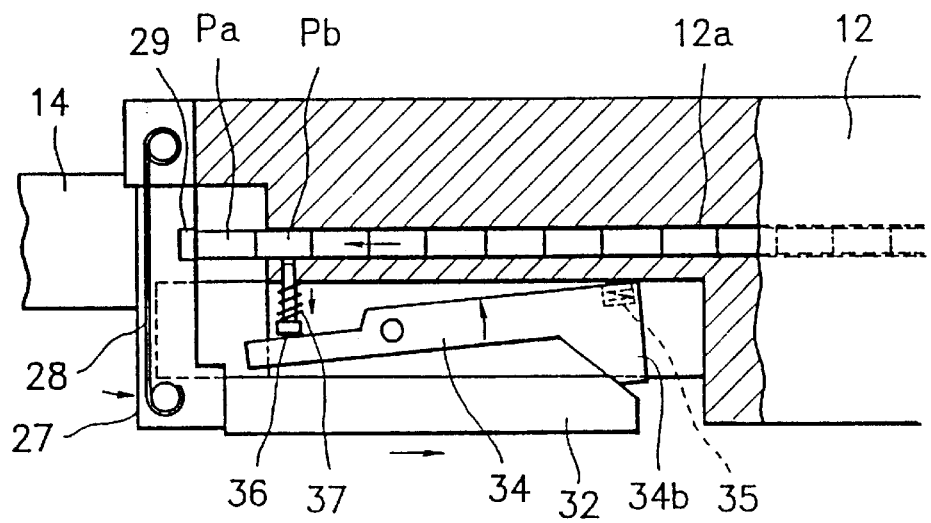
F I G. 11
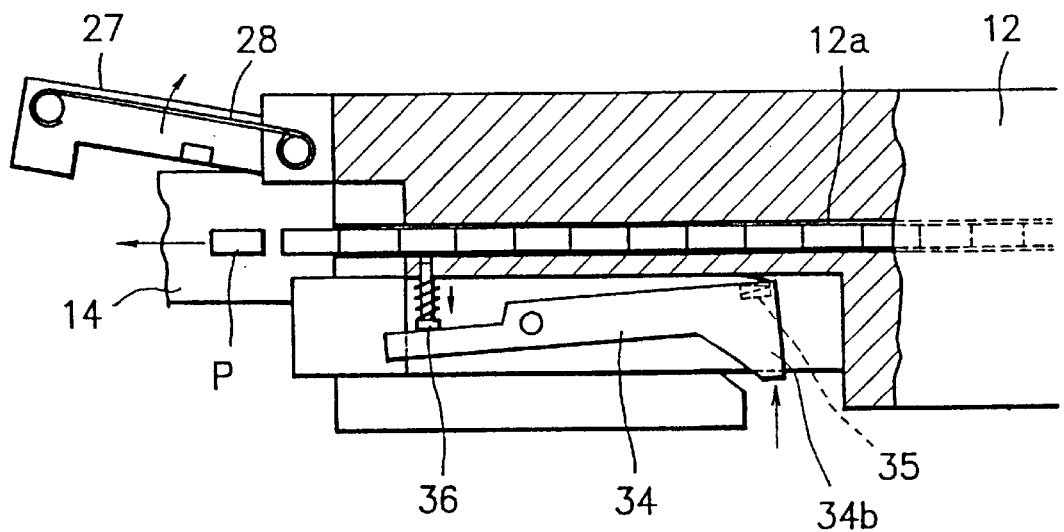

METHOD AND APPARATUS FOR SUPPLYING CHIP PARTS

This application is a continuation of U.S. patent application Ser. No. 09/553,178 filed Apr. 20, 2000, now U.S. Pat. No. 6,250,455.

BACKGROUND OF THE INVENTION

1. Field of the Invention

Throughout the specification and claims the words "chip part(s)" is for "electronic component(s) in a chip form".

This invention is of an apparatus for supplying chip parts being housed in a hopper at random directions after organizing them in an orderly line and of a chip part feeding means which works to transfer the forefront one of the aligned chip parts to a circuit component such as a printed circuit board.

2. Description of the Prior Art

A prior art apparatus comprises a hopper box which houses electronic parts in a chip form (hereafter called "chip parts") being accumulated at random directions, a chip part intake tube connecting into the bottom of said hopper box said chip part intake tube being capable of moving up and down, a mechanism to move said chip part intake tube up and down, a chip part carrier tube extending downward with on end opening into said chip part intake tube, a conveying belt reaching the end opening of said chip part carrier tube which works to convey chip parts being discharged from said chip part carrier tube, a mechanism to move said belt intermittently at a prescribed pitch, a cover which work to organize said chip parts being conveyed on said belt into an orderly line, a stopper which works to stop said chip parts being conveyed on said belt at a prescribed point before opening itself and a mechanism to let the stopper release a chip part after said chip part has come to a stop.

With the aforesaid apparatus, chip parts accumulated in said hopper box are taken into said chip part intake tube by moving said chip part intake tube up and down, said chip parts having been taken into said chip part intake tube being discharged onto said conveying belt through said chip part carrier tube before being conveyed toward said stopper by the intermittent movement of said belt, each of said chip parts having been conveyed by said belt being stopped by said stopper before being released from said stopper to be freed from nipping of said stopper.

Nevertheless, with the aforesaid apparatus of a conventional structure, said stopper merely works to release a chip part after stopping said chip part, when the forefront chip part and the succeeding chip part are clinging each other owing to the environmental humidity or by the influence of treating liquid, etc. having been used in a production process of said chip parts, or when the forefront chip part and the succeeding chip part become entangled by raggedness of their surfaces, the succeeding chip part clings to the forefront chip part when said forefront chip part is being picked up by a pickup means such as a suction head or the position or direction of said succeeding chip part gets disorganized to interfere with chip parts pickup function thereafter, thus impeding mounting of a chip part to a circuit component such as a printed circuit board.

Also, with the aforesaid apparatus of a conventional structure, since the weight of a chip part is extremely light, a slightest force occurring from random contacts between said cover and said chip part being conveyed on said belt causes slips of said chip part on the surface of said belt, thus hindering smooth conveyance of chip parts.

Further, with the aforesaid apparatus of a conventional structure, since the end opening of said chip part carrier tube is being directed almost in parallel with the belt surface, a chip part carrier tube of a considerable length needs be used when doing so. Also, more space is required to install such a chip part carrier tube thus making the dimensions of the apparatus inevitably larger.

Moreover, with the aforesaid apparatus of a conventional structure, since the chip part carrier tube positioned inside the chip part intake tube does not project beyond said chip part intake tube when said chip part intake tube is being moved up and down, some of chip parts having been taken into said chip part intake tube may get caught over the top end of said chip part carrier tube, thus clogging said chip part carrier tube.

Furthermore, since the concentration of chip parts taken out inside said chip part intake tube increases when said chip part intake tube goes down from its upper end position by compression occurring among contained chip parts, when, in turn, said chip part intake tube start to go up from its lower stroke end, more resistance against its rise occurs and, in worst case, said chip part intake tube becomes incapable of rising from its lower stroke end, thus chip part intake function thereof being interrupted.

OBJECTIVES OF THE INVENTION

This invention intends to provide a chip part supplying apparatus wherewith the forefront chip part and the succeeding chip part on a conveying belt can be totally separated for fault-free pickup of the forefront chip part.

This invention also intends to provide a chip part supplying apparatus wherewith unnecessary slippage of chip parts on said conveying belt can be eliminated for secure conveyance of chip parts by said belt.

This invention also intends to provide a chip part supplying apparatus wherewith the distance between chip parts intake point and the conveying belt is being designed as short as possible thus enabling to minimize the dimensions of the whole equipment.

This invention also intends to provide a chip part supplying apparatus wherewith clogging inside the chip part intake tube by chip parts being caught during transit can be eliminated and, at the same time, resistance against rise of said chip part intake tube from its lower stroke end can be reduced, thus performing efficient chip part intake.

This invention also intends to provide a chip part supplying apparatus wherewith chip part transfer onto a circuit component such as a printed circuit board can be carried out securely and at high speed.

Other objectives, structures and effects of this invention than the aforementioned shall be clarified by the descriptions hereafter.

BRIEF DESCRIPTION OF THE DRAWINGS

FIG. 10 is a partly cutout top view showing the processes of separating the forefront chip part.

FIG. 11 is a partly cutout top view showing the movement to pick out a chip part from the belt surface.

DETAILED DESCRIPTION OF THE PREFERRED EMBODIMENTS

Figure 1:
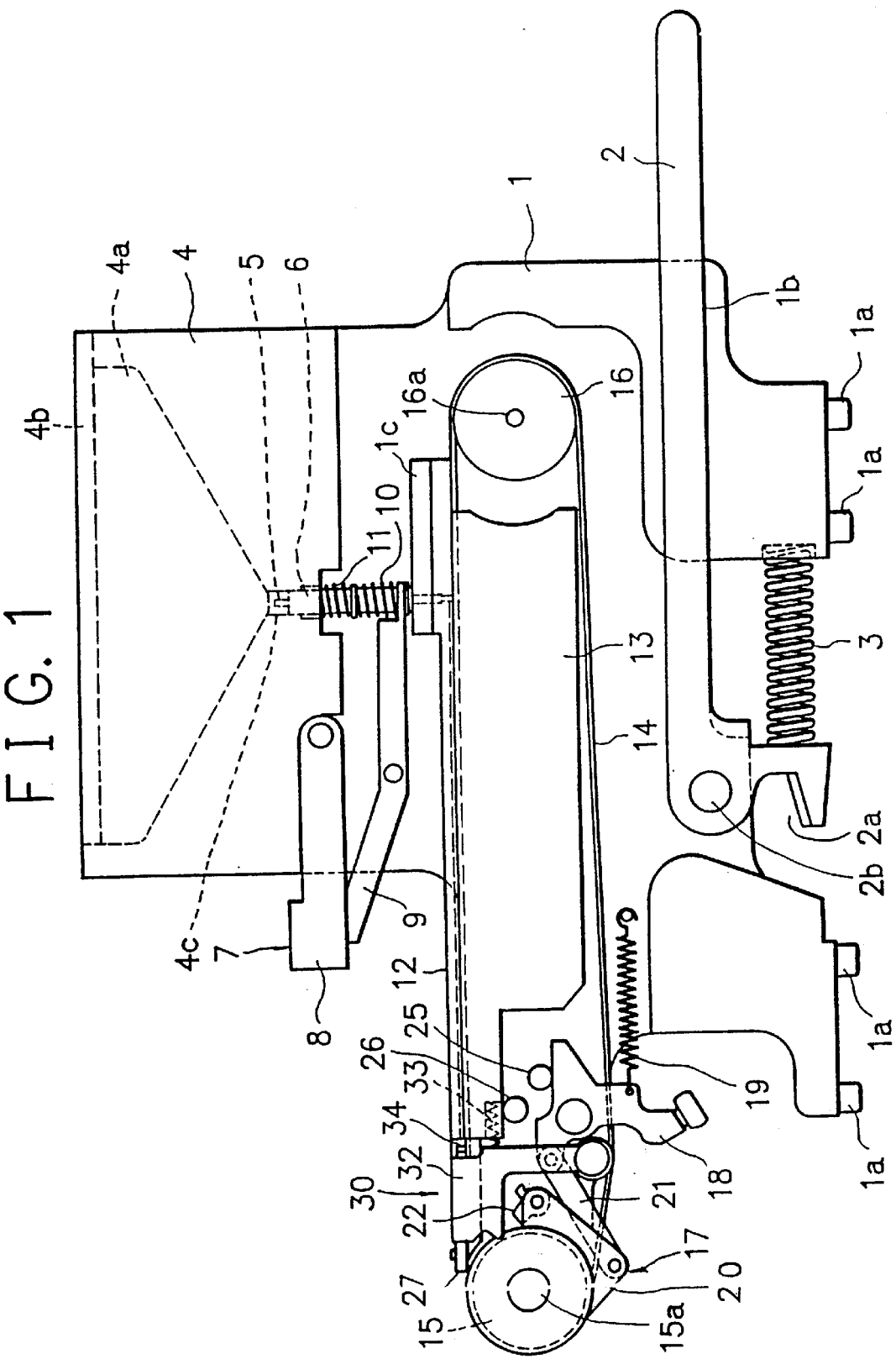
FIG. 1 is a side view of a chip part supplying apparatus of a preferred embodiment of this invention.

Referring more particularly to the exemplary embodiments of this invention, FIG. 1 shows a chip part supplying apparatus according to an exemplary embodiment of this invention. In FIG. 1, numeral 1 stands for the base frame being provided with total four leveling projections 1a on its bottom and a anchoring lever 2 carrying a dented catch 2a at its top on its lower side. Said lever 2 is being pinned down to said base frame 1 by a pin 2b for free pivoting and is being activated toward the clockwise direction in the drawing by a coil spring 3 engaging between the lever 2 and said base frame 1 and the central part thereof contacting a terrace 1b formed on the side of the base frame 1.

Said base frame 1 can be optionally installed on an installation stand by inserting said projections 1a into mating holes opened into the surface of said installation stand and by engaging the dented catch with a mating projection or with a horizontally installed bar being provided on said installation stand, maneuvering said lever.

Figure 2:
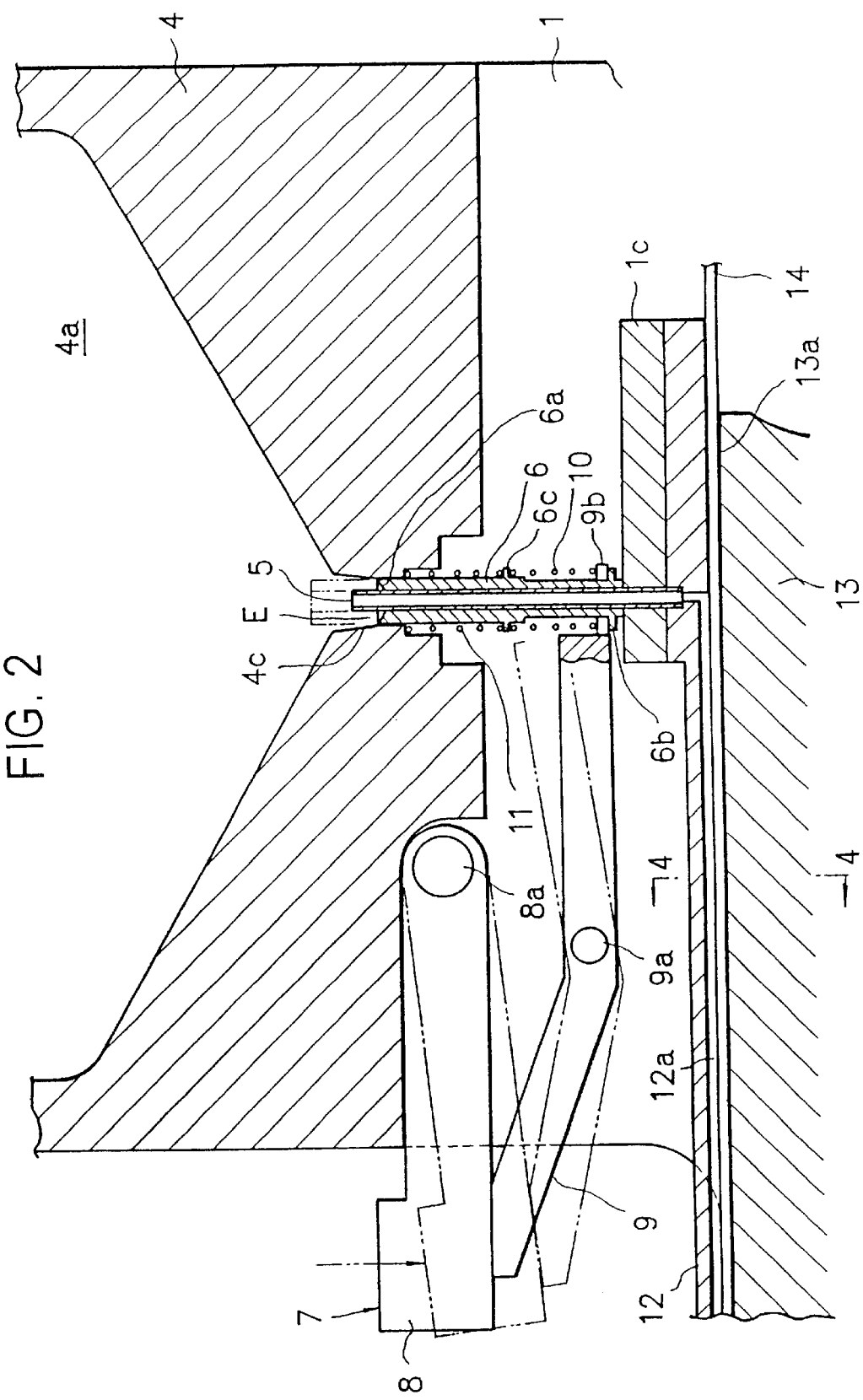
FIG. 2 is an enlarged cross-sectional view showing the chip part intake section and the chip part discharge section.

Numeral 4 stands for a hopper being made of a transparent or translucent material for immediate observation of its content from outside and being attached on said base frame 1. As also shown in FIG. 2, said hopper 4 carries an internal storage chamber 4a the cross-section thereof being in a shape of a reversed triangle and its top opening being closed by a free sliding cover 4b. In the bottom center of said storage chamber 4a, a cylinder hole 4c with a bore diameter allowing free sliding of a moving pipe 6, being described later, and said bore of said cylinder hole 4c being tapered upward at a taper angle of 2° to 5°.

Figure 5A:
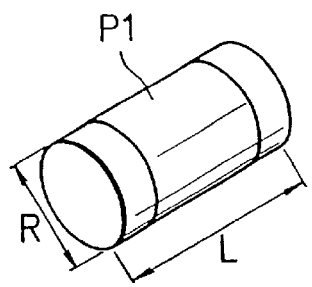
FIGS. 5(a) through (c) are perspective views of the shapes of chip parts applicable to the chip part supplying apparatus shown in FIG. 1.
Figure 5B:
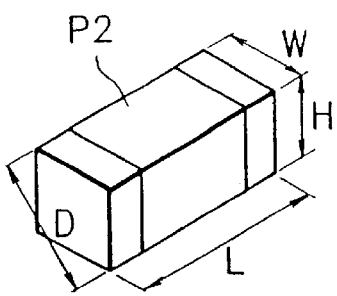
Figure 5C:
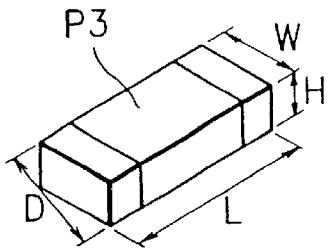

In said storage chamber 4a of said hopper 4, chip parts of a cylindrical shape P1 according to FIG. 5 (a), chip parts of a regular prism, means a square prism shape, P2 according to FIG. 5 (b) or chip parts of a rectangular prism shape P3 according to FIG. 5 (c) shall be stored in a large quantity at random directions.

Figure 3:
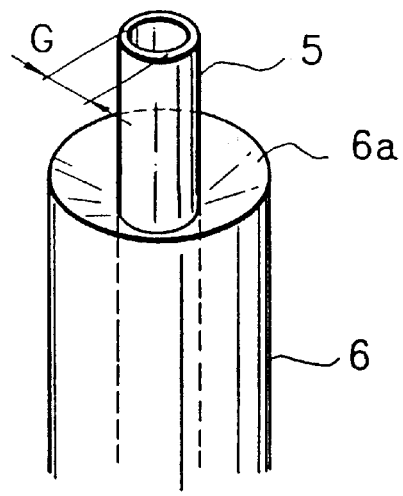
FIG. 3 is a perspective view of the sections of the stationary pipe and moving pipe of the drawing in FIG. 1.

Numeral 5 represents a stationary pipe and, as also shown in FIG. 2, said stationary pipe 5 is being made of a cylindrical pipe material of a prescribed length with its bottom end implanted into a part guide 12 and with its top end reaching an elevation slightly lower than the top end of said cylinder hole 4c and is being aligned in the center of said cylinder hole 4c of said hopper 4. The bore diameter G (See FIG. 3) of said stationary pipe 5 is being so determined to become slightly larger, when being applied for feeding of the chip parts P1 according to FIG. 5 (a), than the diameter R of said chip parts P1 or to become slightly larger, when being applied for feeding of chip parts P2 or P3 according to FIG. 5 (b) or FIG. 5 (c), than the diagonal D of said chip parts P2 or P3, said stationary pipe 5 being so designed to intake said chip parts P1, P2 or P3 in longitudinal direction and to let said chip parts move by their own weight.

Numeral 6 represents a moving pipe and, as also shown in FIG. 2, said moving pipe 6 is being made of a cylindrical pipe material of a prescribed length with a thicker wall thickness than that of the aforesaid stationary pipe 5 and is being suspended between the bore surface of said cylinder hole 4c of said hopper 4 and the outer periphery of said stationary pipe 5, for free up and down movement. Said moving pipe 6 is being provided with a guide plane 6a (See FIG. 3) of a conically dented shape in its top end and is contacting a holder plate 1c at its bottom end and the length of said moving pipe 6 is so determined that the elevation of its top end may come lower than the top end of said cylinder hole 4c of said hopper 4 and, also, lower than the top end of said stationary pipe 5.

Namely, when said moving pipe 6 is at its lower stroke end, a ring shaped pocket E wherein some chip parts can be housed is formed above the top end of said moving pipe 6 between the bore surface of said cylinder hole 4c and the peripheral surface of said stationary pipe 5. Also, on the periphery at the low end and on the periphery in the middle of said moving pipe 6, flanges 6b and 6c are being provided.

Numeral 7 represents a pipe up and down drive mechanism, or a mechanism to move the pipe up and down, and as also shown in FIG. 2, said pipe up-and-down drive mechanism 7 comprises a drive lever 8 being pinned down to said base frame 1 by a pin 8a for free pivoting, a trailer lever 9 being pinned down to said base frame 1 by a pin 9a for free turn around said pin 9a with its U-shaped tip end 9b engaging with said flange 6b being provided on the periphery at the low end of said moving pipe 6, the first coil spring 10 engaging between said U-shaped tip end 9b of said trailer lever 9 and said flange 6c being provided on the periphery in the middle of said moving pipe 6 and the second coil spring 11 engaging between said flange 6c being provided on the periphery in the middle of said moving pipe 6 and said hopper 4, said first coil spring 10 carrying stronger spring constant than said second coil spring 11. said first coil spring 10 carrying stronger sprig constant than said second coil spring 11.

With said pipe up-and-down drive mechanism 7, by pushing down the moving end of said drive lever 8 to push down the outer end of said trailer lever 9 interlocking to the lower plane of said drive lever which in turn works to raise the U-shaped tip end 9b at the inner end of said trailer level 9, thus depressing said second coil spring 11 under the activation of said first coil sprig 10 to bring up said moving pipe 6 to an elevation where its top end comes higher than the top end of said cylinder hole 4c and, also, higher than the top end of said stationary pipe 5 (See the two-dot chain line in FIG. 2). Also, by releasing the depression on the moving end of said drive lever 8, said moving pipe 6 can be lowered back to an elevation where its top comes lower than the top end of said cylinder hole 4c and, also, lower than the top end of said stationary pipe 5. Meanwhile, when a resistance exceeding the spring constant of said first coil spring occurs during the rising process of the moving pipe 6, such resistance can be absorbed by corresponding compression of the first coil sprig 10.

Figure 4:
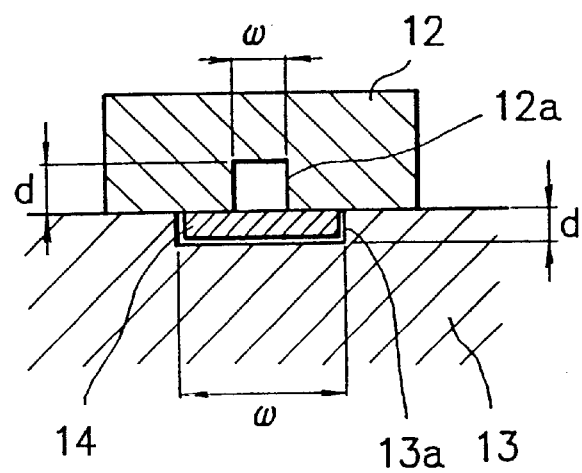
FIG. 4 shows the cross-section 4—4 of the drawing in FIG. 2.

Numeral 12 stands for a chip part guide and, as also shown in FIG. 2 and FIG. 4, said chip part guide 12 is being provided with a linear guide groove 12a with a prescribed width "w" and depth "d" in its bottom, said guide groove 12a being facing the belt guide and being positioned to come just above in the center of a belt 14 being described later. The inner end of said guide groove 12a is being bent to an L-shape and opening into the bottom bore of said stationary pipe 5 carrying the same bore diameter as that of said stationary pipe 5, said bent channel and the inner channel of said stationary pipe 5 constitute a discharge channel to transfer and discharge the chip parts taken into said stationary pipe 5 onto the belt 14.

Figure 7A:
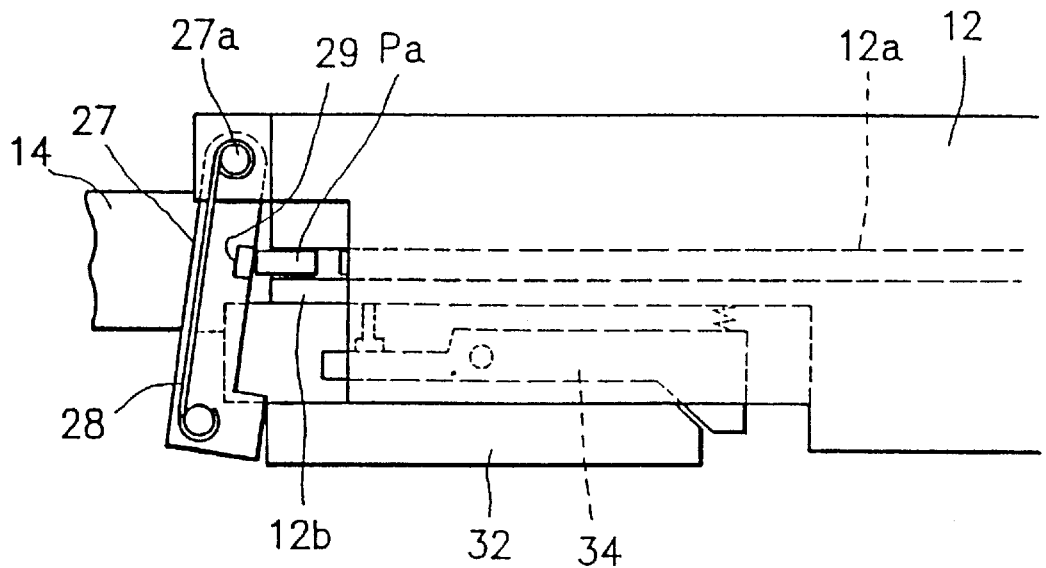
FIGS. 7(a) is an enlarged top view of the chip part pickup section of the drawing in FIG. 1
Figure 7B:
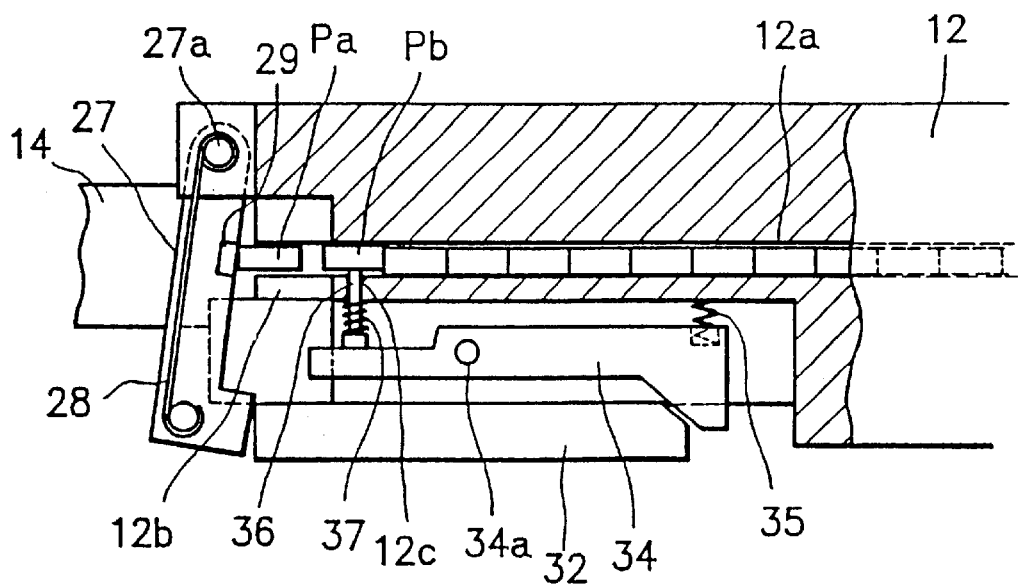
FIG. 7(b) is a partly cutout top view of said chip part pickup section.
Figure 8A:
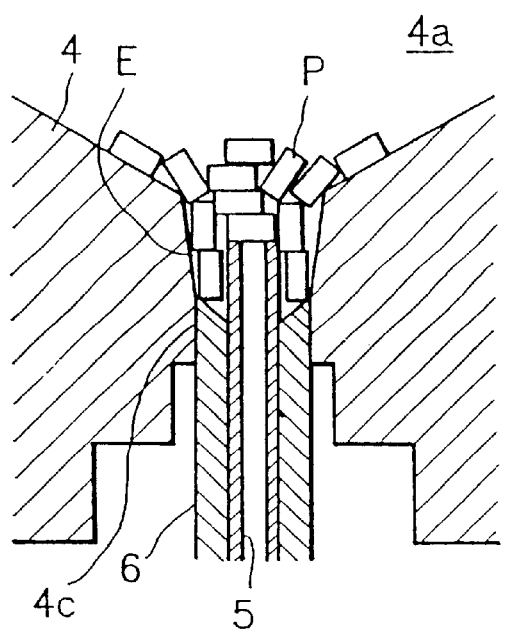
FIGS. 8(a) through (d) are cross-sectional views showing the processes of taking the chip parts into the stationary pipe.
Figure 8B:
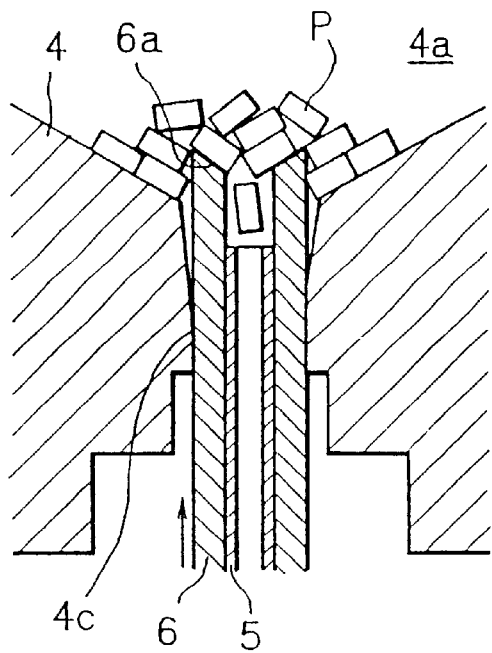
Figure 8C:
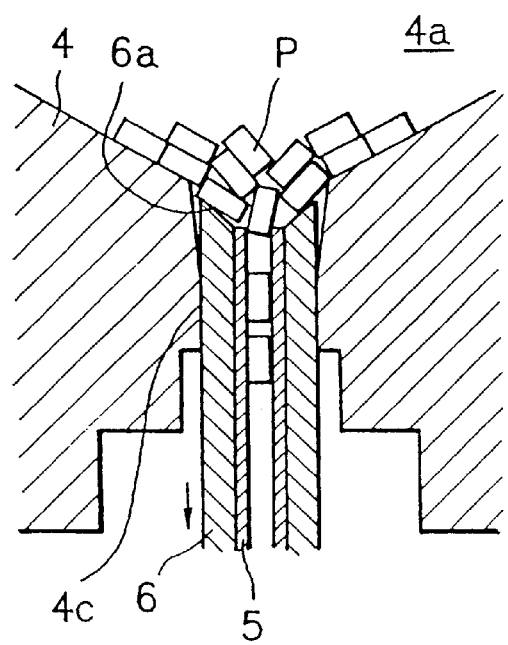
Figure 8D:
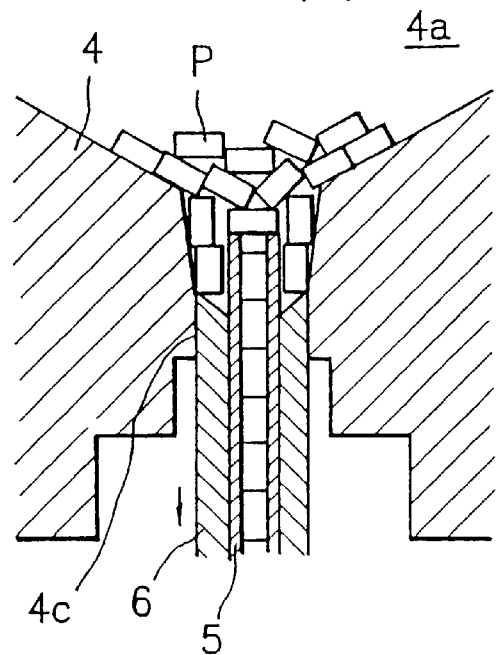

Also, as shown in FIG. 7 (a), the upper section of the tip end of said guide groove 12a is being cutout in order that the forefront chip part Pa may be taken out by an external means, thus forming a chip part pickup port 12b. The width "w" and the depth "d" of the guide groove 12a are being so determined to become slightly larger, when being applied for feeding of the chip parts P1 according to FIG. 5 (a), than the diameter R of said chip parts P1 and the width "w" and the depth "d" of the guide groove 12a are being so determined to become slightly larger, when being applied for feeding of the chip parts P2 or P3 according to FIG. 5 (b) or FIG. 5 (c), than the width W and height H of said chip parts P2 or P3, said guide groove 12a being so designed to intake said chip parts P1, P2 or P3 in a longitudinal line.

Numeral 13 stands for a belt guide and, as also shown in FIG. 2 and FIG. 4, said belt guide 13 is being provided in its top surface with a linear guide groove 13a with a prescribed width "w" and a prescribed depth "d" and is being attached to the side of the base frame 1. The width "w" and depth "d" of said guide groove 13a are slightly larger than the width and thickness, respectively, of the belt 14, thus allowing said belt 14 to travel along said guide groove 13a free from abrasive resistance.

Numeral 14 stands for an endless belt to carry the chip parts, said endless belt 14 being a flat belt or a timing belt made of synthetic rubber or molded soft resin. Said belt 14 engages with a pair of pulleys 15 and 16 being mounted for free rotation to the side of the base frame 1 at a prescribed distance between each other by means of pins 15a and 15b, respectively, and, as shown in FIG. 4, the upper running half of said belt 14 are being so designed to travel along said guide groove 13a of said belt guide 13, facing its upper surface with the bottom surface of said chip part guide 12.

Meanwhile, when being applied for feeding of chip parts with smaller diameter and height, said chip parts may be duplicated on the belt 14 owing to the elasticity said belt possesses, namely by deflection thereof, and to avoid such duplication of chip parts, employment of a workable thinnest belt 14 to lessen its elastic deflection extent is being preferred and, at the same time, it is desirable to design the clearance between the belt 14 and guide groove 13a of the belt guide as small as possible or to use a metallic belt which is free from elastic deflection.

Figure 6:
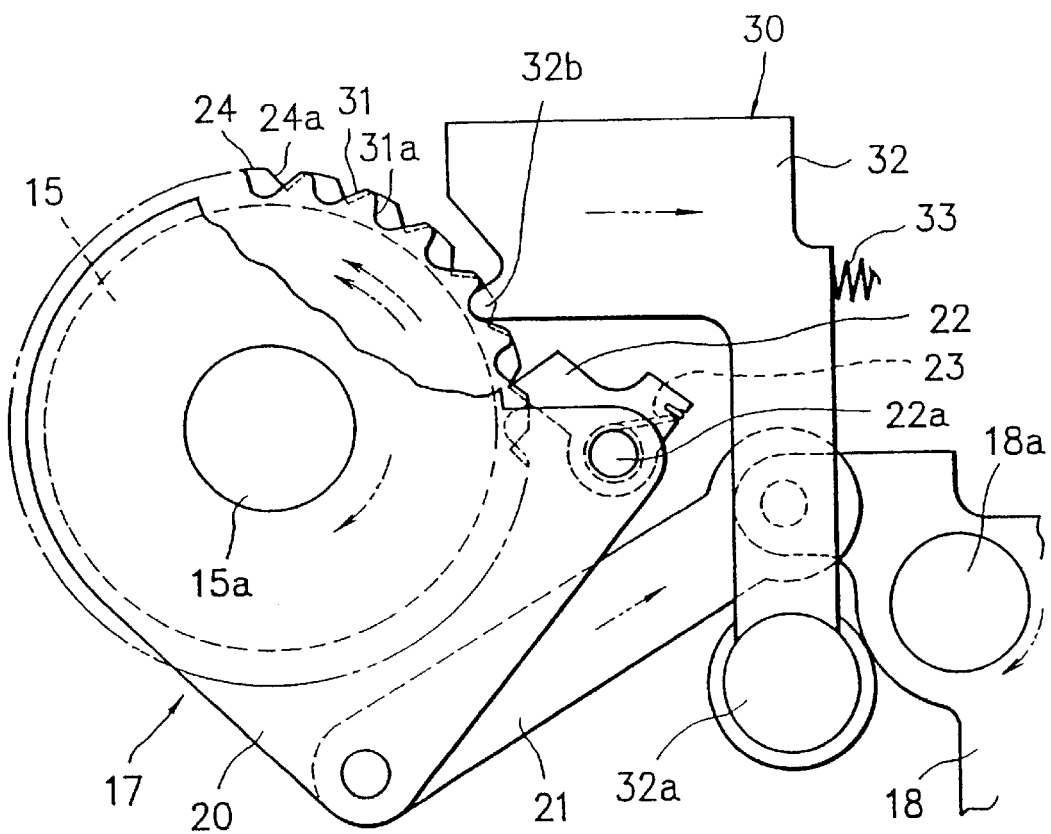
FIG. 6 is an enlarged detail view of the belt driving mechanism being shown in the drawing in FIG. 1.

Numeral 17 stands for a belt driving mechanism and, as also shown in FIG. 6, said belt driving mechanism 17 comprises a drive lever 18 pinned down to the side of the base frame 1 by a pin 18a for free turning, a coil spring 19 (See FIG. 1) activating said drive lever 18 backward, a trailer plate 20 being pinned down by the pin 16a of the aforesaid front side pulley 15 for free turn, a link 21 interlocking the turns of said drive lever 18 and said trailer plate 20, a claw 22 being pinned down to an end of said trailer plate 20 by a pin 22a for free turns, a coil spring 23 which activates said claw 22 toward counter-clockwise direction in the drawing and a ratchet wheel 24 being integrally attached coaxially to said front side pulley 15, the stop point and turning limit of said drive lever 18 being determined by the pins 25 and 26 (See FIG. 1) provided on the side of said baser frame 1.

With said belt driving mechanism 17, by pulling the moving end of said drive lever 18 toward this side against the spring force of said coil spring 19, said trailer plate 20 can be turned clockwise by a prescribed angle by function of said link 21 to let said claw 22 proceed, during the corresponding turn, to engage with the adjacent ratchet teeth 24a from the one said claw 22 has thus been engaging with (See the two-dot chain line arrow in FIG. 6). While, by releasing the pulling force of said drive lever 18, said trailer plate 20 can be turned back counter-clockwise, in the drawing, to let said claw 22 engaging with said ratchet wheel 24 in the same direction and by the same angle as with the front side pulley 15, thus driving the belt 14 forward by a prescribed pitch. Meanwhile, with the illustrated example, the belt driving pitch for one lever stroke is being so designed to become larger than the length L of a chip part.

Numeral 27 stands for a stopper and, as also shown in FIG. 7, said stopper 27 is being pinned down to the front end of the chip part guide 12 by a pin 27a for free pivoting and, also, being activated toward the counter-clockwise direction in the drawing by a coil spring 28. Also, a permanent magnet 29 is being implanted flush in the side surface facing said chip part guide 12 of said stopper 26 at the position in alignment with the front end of the guide groove 12a. Said permanent magnet 29 being so positioned that its one side each of the North-pole and South-pole faces the front end of said guide groove 12a and its highest magnetic field is in alignment with the center of said guide groove 12a. Under a state where the return plate 32, being described later, stays apart from said stopper 27 (See FIG. 10), said stopper 27 is being depressed to the front end of said guide groove 12a of said chip part guide 12 being activated by the coil spring 28.

Numeral 30 stands for a stopper release mechanism and, as also shown in FIG. 6 and FIG. 7, said stopper release mechanism 30 comprises a ratchet wheel 31 being coaxially attached to the front side pulley 15, return plate 32 being pinned down to the side of the base frame 1 by a pin 32a for free pivoting, the first coil spring 33 engaging between said return plate 32 and belt guide 13 activating said return plate 32 in the forward direction, a chip part holder lever 34 being pinned down to a front section of said chip part guide 12 by a pin 34a for free turns, the second coil spring 35 activating said chip part holder lever 34 toward the clockwise direction in the drawing, a chip part holder pin 36 piercing through a through hole 12c opened through the front side of said guide groove 12a and the third coil spring 37 activating said chip part holder pin 36 toward outside.

When said return plate 32 is being pushed forward according to status of the drawing, said chip part holder lever 34 is being activated toward the clockwise direction in the drawing by said second coil spring 35 thereby said chip part holder pin 36 is being pushed toward the inside of said guide groove 12a by activation of said coil spring 37 and said chip part holder pin 36 in turn depresses the next chip part Pb onto the opposite side surface of said guide groove 12a thus holding the next chip part at the position as is. Also, by depression of the return plate 32, the stopper 27 is being opened forward and the forefront chip part Pa follows suit being attracted by said permanent magnet 29 implanted in the surface of said stopper 27, thus being completely separated from the next chip part Pb.

Said stopper release mechanism 30 is capable of, through the process whereby said ratchet wheel 31 turns integrally with the aforesaid ratchet wheel 24 of the aforesaid belt driving mechanism 17 (namely, the process whereby the belt 14 moves forward by a prescribed pitch), the claw 32b of said return plate 32 proceeds to engage with the adjacent ratchet tooth 31a from the one said claw 32b has so far been currently engaging with, thus shifting the return plate 32 by the distance corresponding to the tooth pitch (See the three-dot chain lined arrow in FIG. 6.). Also, when said return plate 32 moves backward, as shown in FIG. 10, said stopper 27 moves to contact the front end of said guide groove 12a by activation of said coil spring 28 and, at the same time, the projection 34b of said chip part holder lever 34 is pushed toward inside and said chip part holder lever 34 turns toward the counter-clockwise direction in the drawing resisting the activation of said second coil spring 35. By this action, the depression on the chip part holder pin 36 by said chip part holder lever 34 is released and said chip part holder pin 36 is pushed out by activation of the third coil sprig 37 thus releasing its depression onto the next chip part Pb.

Explanations shall hereafter be made on the processes of taking the chip parts into the stationary pipe of the aforementioned chip part supplying apparatus referring to FIGS. 8 (*a*) through (*d*).

The drive lever 8 of the pipe up-and-down drive mechanism 7 and the drive lever 18 of the belt driving mechanism 17 are so designed to be pushed in synchronization with the lowering action of the suction head toward the chip part pickup port 12b of the chip part guide 12 to take out the forefront chip part, by part of the movement of said suction head or by a separate driver.

Under the status according to FIG. 8 (*a*) wherein the moving pipe 6 is at its lower stroke end, chip parts P inside the storage chamber 4a accumulate over said stationary pipe 5 and said moving pipe 6 and some chip parts P also enter into the ring shaped pocket E being formed above said moving pipe 6.

During the process wherein said moving pipe 6 moves up from its lower stroke end to its upper stroke end, as shown in FIG. 8 (*b*), the movement of said moving pipe 6 demolishes the overhead accumulation of the chip parts P and, at the same time, moves whatever chip part lying across the opening of the stationary pipe, if any. Under the status according to FIG. 8 (*b*) wherein said moving pipe 6 is at its upper stroke end, chip parts P existing over said moving pipe 6 may form bridges to hinder intended operation, but said bridge formations, if any, can be demolished by the apparent jetting up motion of said stationary pipe 5 when, actually, said moving pipe 6 goes down from its upper stroke end.

Chip parts can be taken into said stationary pipe 5 during both upgoing process and downcoming process of said moving pipe 6 and chip parts P being housed in said storage chamber 4a are taken into the bore of said stationary pipe 5 one by one, being directed longitudinally, by help of the function of the conically dented shape of the guide surface 6a.

Since the moving pipe 6 is being driven up-and-down to repeat the cycle of going up from its lower stroke end and coming down from the upper stroke end back to its lower stroke end, even is chip parts P accumulate in the ring shaped pocket over the moving pipe 6, they cannot not stay clogging there.

Moreover, since it is so designed that the top end of the moving pipe 6 comes under the top end of the cylinder hole 4c and, also, the top end of the stationary pipe 5 to form a ring shaped pocket E when said moving pipe 6 comes to its lower stroke end, even if the parts density above said stationary pipe 5 increases while said moving pipe 6 are coming down, said moving pipe 6 can shift to rising movement from its lower stroke end under reduced start-rising resistance thanks to the ring shaped pocket E wherein the parts density tends to become more coarse, and said moving pipe 6 can shift to rising movement smoothly, thus eliminating the trouble such that the moving pipe 6 cannot move up from its lower stroke end to allow smooth chip part intake into the bore of said stationary pipe 5.

Figure 9A:
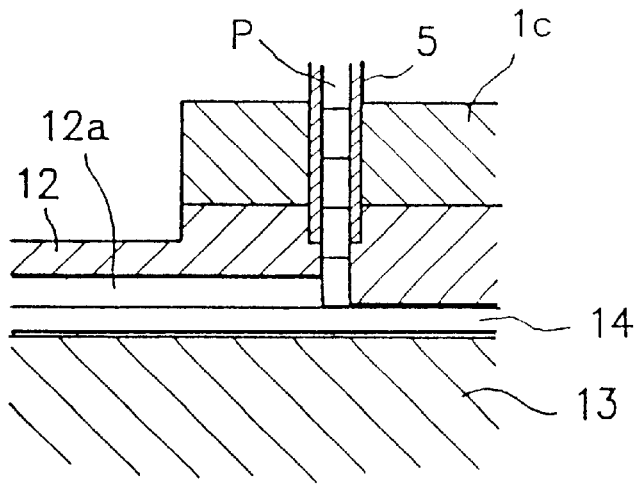
FIGS. 9(a) through (c) are cross-sectional views showing the processes of discharging the chip parts onto the belt.
Figure 9B:
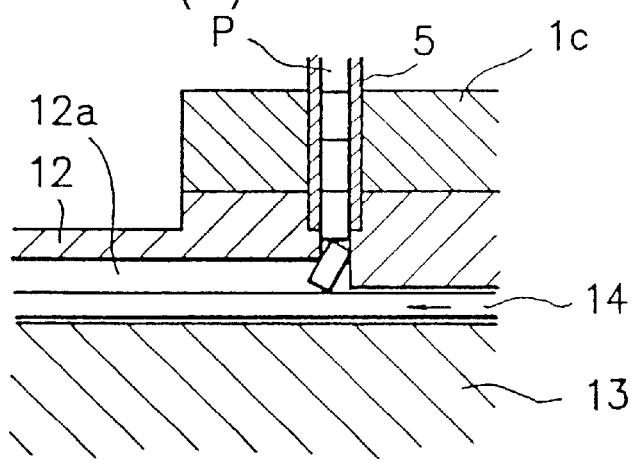
Figure 9C:
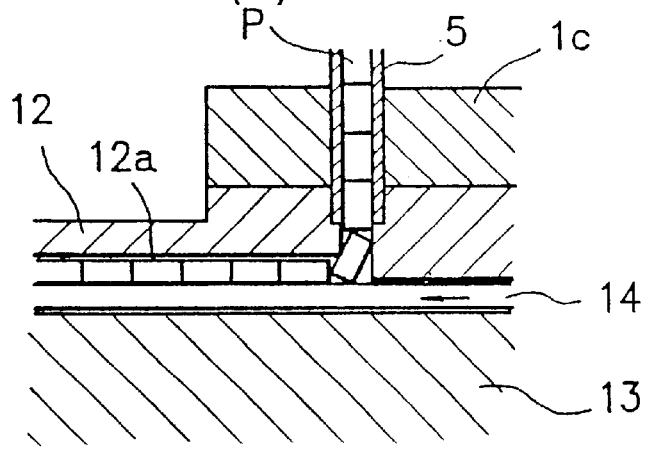
Figure 12A:
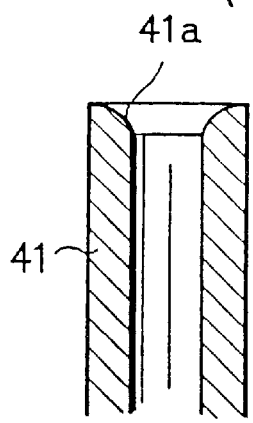
FIGS. 12(a) through (c) are cross-sectional views showing different choices of the shape of the moving pipe, FIGS. 12 (d), (e), (g) and (h) are perspective views showing different choices of the shape of the moving pipe and FIG. 12 (f) is a top view showing a choice of the shape of the moving pipe.
Figure 12B:
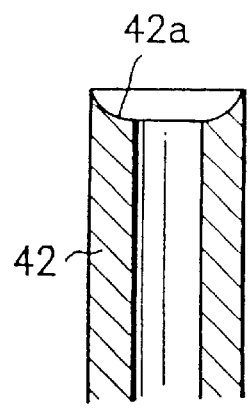
Figure 12C:
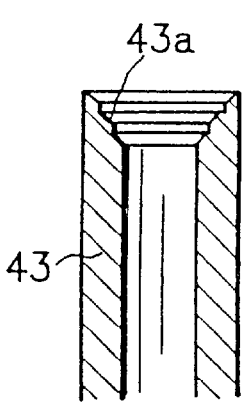
Figure 12D:
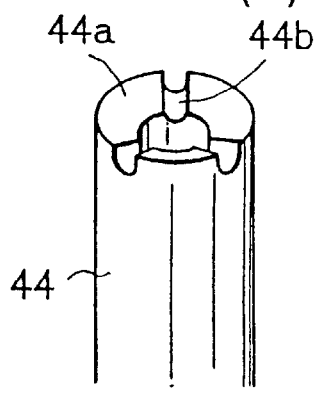
Figure 12E:
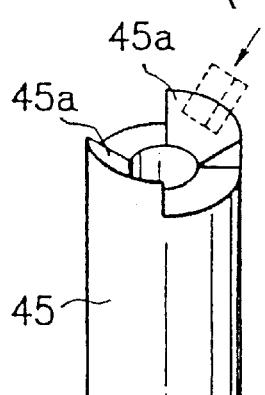
Figure 12F:
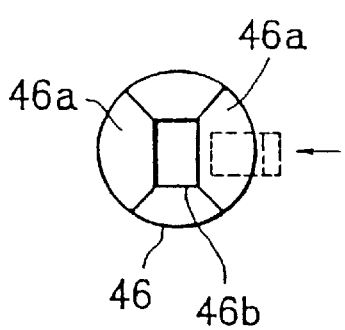
Figure 12G:
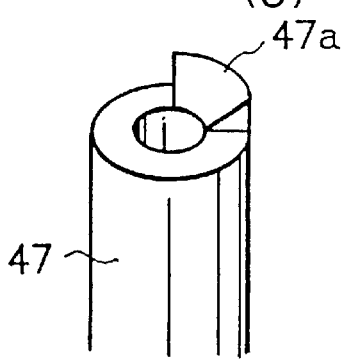
Figure 12H:
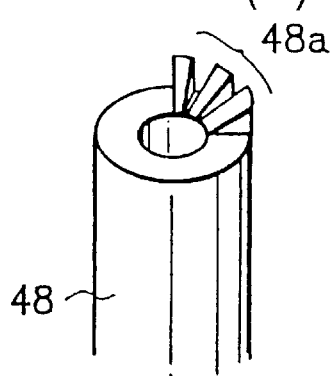

Explanations shall hereafter be made on the processes of discharging the chip parts onto the belt of the aforementioned chip part supplying apparatus referring to FIGS. 9 (*a*) through (*c*).

As shown in FIG. 9 (*a*), chip parts P taken into the stationary pipe 5 move inside its discharge channel by their own weight, being directed longitudinally, and the chip part reaching the low end of said discharge channel contacts its end onto the surface of the belt 14. As shown in FIG. 9 (*b*), since said belt 14 moves forward by a prescribed pitch each time, in synchronization with the up-and-down movement of the moving pipe 6, the chip part having reached the low end of said discharge channel and contacting its end to the surface of said belt 14 is pushed forward by the belt 14 movement to incline forward before lying flat on said belt 14.

Said chip part having reached the low end of the discharge channel can be easily moved forward to lye on the belt 14 by the forward drive being applied by said belt movement to its corner contacting the belt surface, since said chip part P is being depressed by the weight of chip parts P staying in line above said chip part P at low end. However, if, by any chance, said chip part at the low end is transferred forward without forward inclination, the front side corner being formed between the end of the guide groove 12*a* of the chip part guide 12 and the end of the discharge channel pushes the upper surface of said chip part P to force it lye flat on the belt without exceptions. chip parts lying on said belt 14 moves forward on said belt 14 being organized by said guide groove 12 to align in longitudinal direction. Since the intermittent belt feed is repeated, the forefront chip part P on said belt 14 being taken out each time said belt is fed for a pitch, the lowest positioned chip part P in said discharge channel is discharged onto said belt 14 one by one to lye flat on it. (See FIG. 9 (*c*)).

Since the stationary pipe 5 is being positioned almost vertical to the upper surface of said belt 14, chip parts P taken into said stationary pipe 5 move by their own weight down to said belt 14 securely and smoothly without resistance. Also, since the low end chip part P in the discharge channel is being delivered onto the belt 14 after turning it to lye flat on said belt 14 taking advantage of the movement of said belt, as compared with similar apparatuses wherewith the chip parts are being directed to lye flat on the belt by inclination of the discharge channel, the distance of the discharge channel can be made shorter and, consequently, the distance between the hopper 4 and belt 14 can also be made shorter, thus making it possible to design a chip part supplying apparatus of a smaller size.

Explanations shall hereafter be made on the processes of separating the forefront chip part with the aforementioned chip part supplying apparatus referring to FIG. 10 and FIG. 7 (*b*).

The return plate 32 of the stopper release mechanism 30 moves backward during initial part of the belt feed for a prescribed pitch being activated altogether by the belt driving mechanism 17. When said return plate 32 moves backward, as shown in FIG. 10, the stopper 27 presses onto the front end of the guide groove 12*a* being activated by the coil spring 28 and the projection 34*b* of the chip part holder lever 34 is pushed inward to let said chip part holder lever 34 turn toward the counter-clockwise direction in the drawing resisting the activation of the second coil spring 35. By this movement, the pressure to the chip part holder pin 36 of said chip part holder lever 34 is released to allow said chip part holder pin 36 to move out by activation of the coil spring 37 to release the next chip part Pb before all the chip parts on said belt 14 moves forward on said belt 14 to stop at the point where the current forefront chip part contacts the permanent magnet 29 installed in the stopper 27.

When the belt is fed for the prescribed pitch, the return plate 32 of the stopper release mechanism moves forward by activation of the first coil spring 33. When the return plate 32 moves forward, as shown in FIG. 7 (*b*), depression to said chip part holder lever 34 of said return plate 32 is releases and said chip part holder lever 34 turns back toward the clockwise direction in the drawing by activation of the second coil spring 35 whereby said chip part holder pin 36 is pushed inside the guide groove 12*a* resisting the activation of the third coil spring 37, thus pushing the next chip part Pb against the other side of the guide groove 12*a* to sustain the second chip part at the position. Also, by depression of said return plate 32, said stopper 27 opens forward to pull out the forefront chip part Pa being attracted by the permanent magnet 29 implanted in said stopper 27, thus totally separating the forefront chip part from the next one.

Since the forefront chip part Pa can be stopped at the prescribed point by depressing the stopper 27 to the front end of the guide groove 12*a* when all the chip parts on the belt 14 moves forward on said belt 14, and as the stopper 27 opens forward to pull out the forefront chip part Pa attracting by its permanent magnet 29 while sustaining the next chip part Pb at its position to separate these two chip parts forcefully when a feed by the prescribed pitch of all the chip parts on the belt 14 ends, the forefront chip part Pa can be always separated from the next chip part Pb without fail even when the forefront chip part and the next chip part are being stuck by environmental moisture or by influence of treatment liquid or the sort having been used during the production processes of said chip parts or when the next chip part Pb is being caught by the forefront chip part Pa by their surface coarseness, thus eliminating such troubles as dragging of the next chip part Pb together with the forefront one or disturbance of the alignment or positioning of the succeeding chip parts, thus allowing smooth and secure pickup by an attraction head, etc. of the forefront chip part Pa.

The forefront chip part Pa is picked up from the belt surface successively by an attraction head, etc. of the part mounting equipment to be transferred onto a circuit component such as a printed circuit board. As aforesaid, since the forefront chip part Pa becomes totally separated from the next chip part Pb each time it is stopped by the stopper 27, the forefront chip part Pa can always be picked up securely and smoothly thus allowing satisfactory and high speed chip part transfer onto a circuit component such as a printed circuit board.

The aforementioned chip part supplying apparatus possesses the following advantages in addition to what have heretofore been described. Namely, even when the forefront chip part Pa is excessively depressed by the suction head or the sort while being picked up from the surface of the belt 14, such a depressing force can be absorbed by the elasticity characteristic with said belt 14. Also, since the belt guide 13 extends all the way down to the position below the chip part pickup port 12*b* of the part guide 12, even when a depressing force is applied when picking up the forefront chip part, there is no fear of its sinking excessively from its original elevation.

Moreover, even if a failure occurs in picking up of the forefront chip part, the stopper 27 stops all the succeeding chip parts on said belt 14 at the next feed pitch to let said belt 14 only move forward by a pitch, thus preventing jumping out of the forefront chip part Pa and eliminating disturbances against alignment and positionings of succeeding chip parts. Moreover, since the belt feeding pitch is being determined to become larger than the length L of the chip part, even if discharge of chip parts onto the belt 14 from the stationary pipe 5 stagnates temporarily to cause blank space among lined chip parts, belt feeds thereafter can catch up to fill these blank space.

Furthermore, as shown in FIG. 11, by forcing the stopper 27 to open totally by fingers and by pressing the projection 34b of the chip part holder lever 34 inward by a finger to let the chip part holder pin 36 release the next chip part Pb, all the chip parts P remaining inside the guide groove 12a of the chip part guide 12 can be discharged through the front end of said guide groove 12a letting them drop by their own weight until the guide groove 12a is emptied, thus facilitating the chip part type switching over processes.

Explanations shall hereafter be made on other choices of the structure of the aforementioned chip part supplying apparatus referring to FIG. 12 through FIG. 33. Meanwhile, in these explanations, component parts and sections of the same structures as ones being indicated in FIG. 1 shall be coded by the same numbers and their descriptions shall not be repeated.

FIGS. 12 (a) through (h) show other choices of the moving pipe. The moving pipe 41 shown as FIG. 12 (a) carries a guide plane, the cross section of which being in a convex shape down from the bore up to the periphery of the pipe. The moving pipe 42 shown as FIG. 12 (b) possesses a guide plane, the cross section of which being in a concave shape down from the bore up to the periphery of the pipe. The moving pipe 43 shown as FIG. 12 (c) carries a guide plane 43a, the cross section of which constituting multiple terraces stepping down toward the bore.

The moving pipe 45 being shown as FIG. 12 (d) carries plural number of grooves 44b being formed in the guide plane 44a of a conically dented shape, the width of said grooves being smaller than that of the chip parts (in this drawing, three grooves at equal intervals). When this type of moving pipe 44 is used, chip parts lying on the guide plane 44a can be unstabilized by said grooves 44b thus enhancing the probability of taking chip parts into the bore of said moving pipe 44.

The moving pipe being shown as FIG. 12 (e) carries split guide planes 45a, the cross section of which being in a conically dented shape and said split guide plane facing each other symmetrically, their cross sectional surfaces forming an angle of about 90°. While, the moving pipe 46 being shown as FIG. 12 (f) carries split guide planes 46a, the cross section of which being in a conically dented shape and said split guide plane facing each other symmetrically, their cross sectional surfaces forming an angle of about 90°, but with a rectangular center opening 46b whereto a rectangular stationary pipe can be inserted. These two choices of the moving pipe should be effective when handling chip parts of a flat rectangular prism shape (See FIG. 5 (c)) and said chip parts can only be taken into the moving pipe 45 or 46 after lying on said guide plate 45a or 46a on their wider side and in longitudinal direction and any chip parts directed otherwise or existing away from said guide plane 45a or 46a finally drop outward away from said guide plane 45a or 46a and cannot be taken inside the moving pipe 45 or 46. Meanwhile, the angle being produced between the cross-sectional surfaces of the two split guide planes 45a or 46a can be smaller than 90° or the guide plane can be a single part like the one used with the moving pipe 47 of FIG. 12 (g). Also, said guide planes 45a or 46a can be formed in multiple split pieces (48a) such as ones used with the moving pipe 48 of FIG. 12 (h).

Figure 13A:
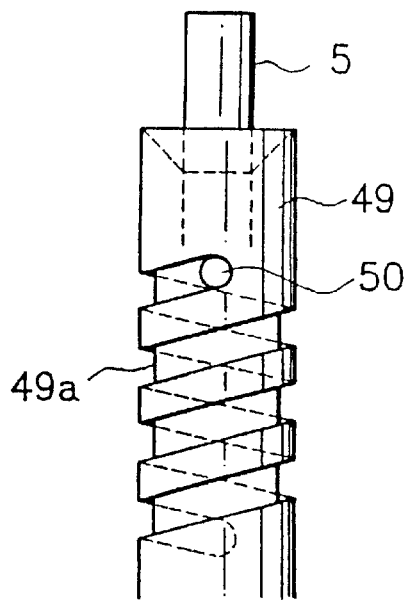
FIG. 13(a) is a side view showing a choice of the shape of the moving pipe and FIG. 13(b) is an explanatory drawing indicating its movement.
Figure 13B:
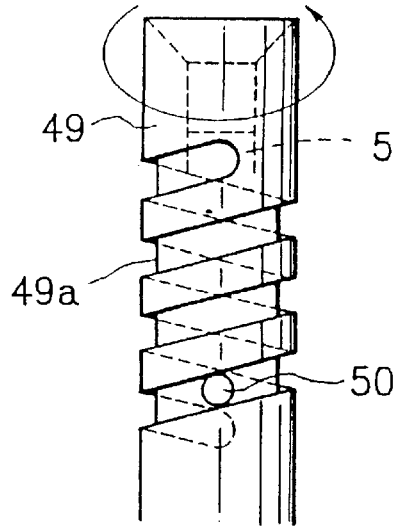

FIG. 13 (a) shows another choice of the moving pipe, more specifically, with a structure wherewith said moving pipe can rotate around its axis while moving up and down. A spiral groove 49a is being formed in the outer peripheral surface of said moving pipe 49, and a pin 50 which engages with said spiral groove 49a is projecting from a point on the bore surface of the cylinder hole of the hopper. With a moving pipe of this structure, as shown in FIG. 13 (b), when the moving pipe 49 is moved up or down against the stationary pipe 5, said moving pipe 49 rotates around its axis right-wise or left-wise, said rotary movement being effective to lessen the start-rising resistance and, at the same time, said rotary movement helping to demolish chip parts accumulation which in turn enhances the probability of taking in of the chip parts. Meanwhile, similar rotary movement can be acquired by forming the spiral groove in the bore surface of the cylinder hole of the hopper and planting a pin to project at a point on the outer peripheral surface of the moving pipe.

Figure 14A:
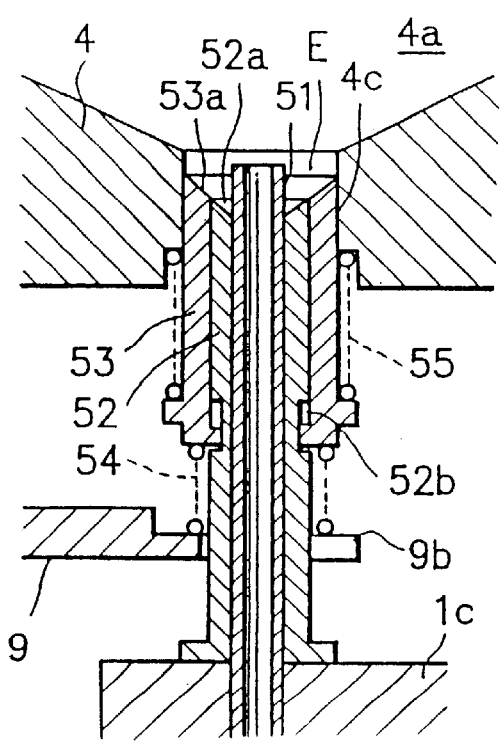
FIG. 14(a) is a side view showing another choice of the shape of the moving pipe and FIG. 14 (b) is an explanatory drawing indicating its movement.
Figure 14B:
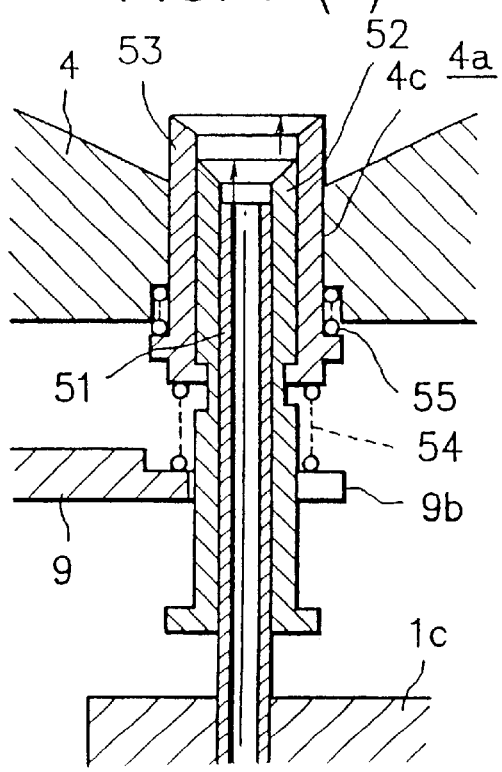

FIG. 14 (a) shows some other choice of the moving pipe, more specifically, a moving pipe assembly with a duplex moving pipe structure. The first moving pipe 52 is being positioned around a stationary pipe 51 for free vertical movement and the second moving pipe 53 is being positioned around said first moving pipe 52 for free vertical movement. The two moving pipes 52 and 53 are being provided with a guide plane 52a or 53a of a conically dented shape at their top end and the up and down movement of the second moving pipe is being restricted within the range of the groove 52b being formed on the outer peripheral surface of said first moving pipe 52. Also, the first coil spring 54 engages between the U-shaped tip end 9b of the trailer lever 9 and the bottom plane of said second moving pipe 53 and the second coil spring 55 engages between the flange being provided near the low end of said second moving pipe 53 and the bottom of the hopper.

At the status according to FIG. 14 (a) wherein the two moving pipes 52 and 53 are at their lower stroke end, the bottom plane of said first moving pipe 52 contacts the holder plate 1c and a ring-shaped pocket E is being formed above the top ends of the two moving pipes 52 and 53. Meanwhile, the first coil spring 54 carries a higher spring constant than the second coil spring 55.

With a moving pipe assembly of this structure, as shown in FIG. 14 (b), when the U-shaped top end 9b of the trailer lever 9 rises, the second coil spring 55 is compressed under the force of the first coil spring 54 to let the second moving pipe 53 rise said second moving pipe 53 in turn brings up the first moving pipe 52 by engagement between the groove 52b of the first moving pipe 52 and the bottom of the second moving pipe 53. Whereas, when the rising force of the U-shaped tip end of said trailer lever 9 is released, the two moving pipes 52 and 53 come down by activation of the second coil spring 55. Namely, by function of the second moving pipe 53, accumulations of chip parts being stored in the storage chamber 4 can be demolished in wider range and, in addition, under this structure, even when the remainder of chip parts decreases to a small quantity, all the remaining chip parts can be gathered over the stationary pipe 51 to intake all. Other functions and effects are the same as with the moving pipe according to FIG. 1.

Figure 15:
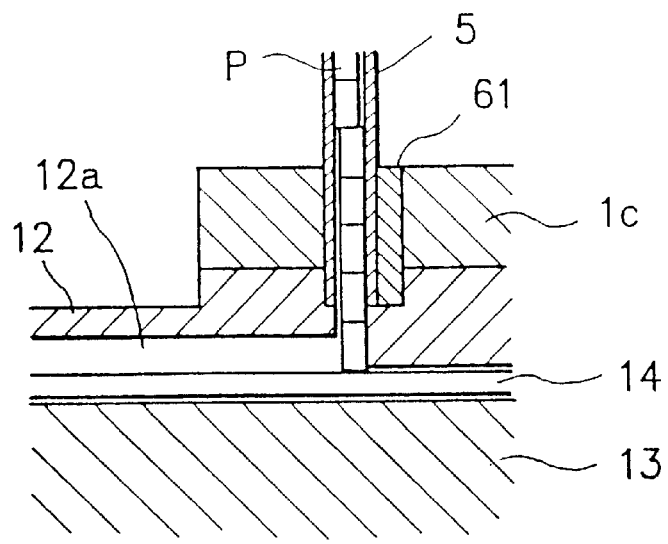
FIG. 15 is a cross-sectional view of a choice of the shape of the stationary pipe.
Figure 16A:
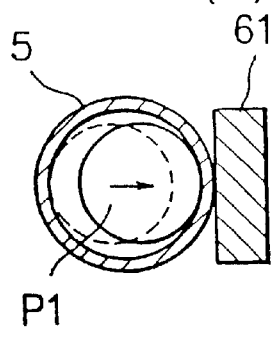
FIGS. 16(a) through (c) are explanatory drawings indicating effects of the stationary pipe of FIG. 15 for chip parts with different shapes and FIGS. 16 (d) and (e) are cross-sectional views showing some other choices of the shape of the stationary pipe.
Figure 16B:
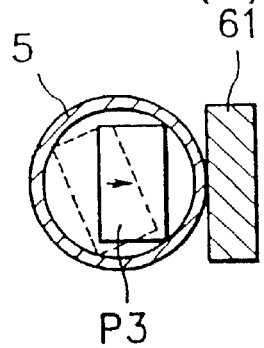
Figure 16C:
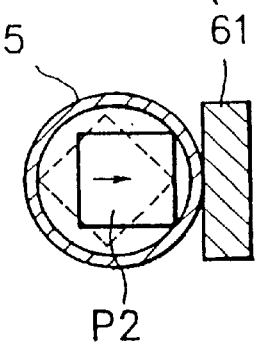
Figure 16D:
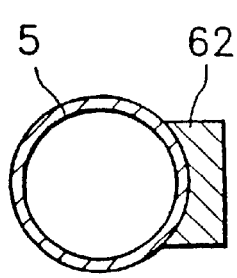
Figure 16E:
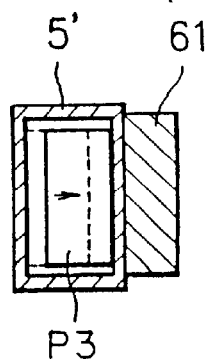
Figure 17A:
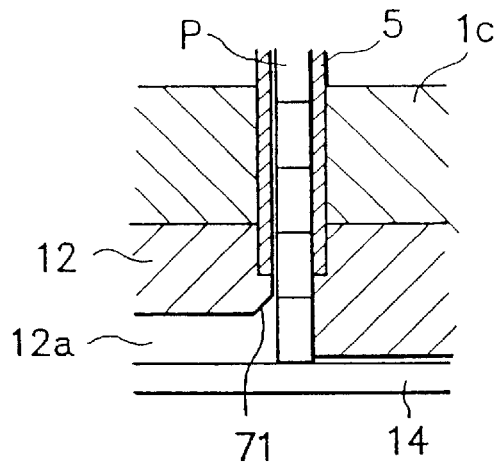
FIGS. 17(a) through (e) are cross-sectional views showing different choices of the shape of the chip part discharge section.
Figure 17B:
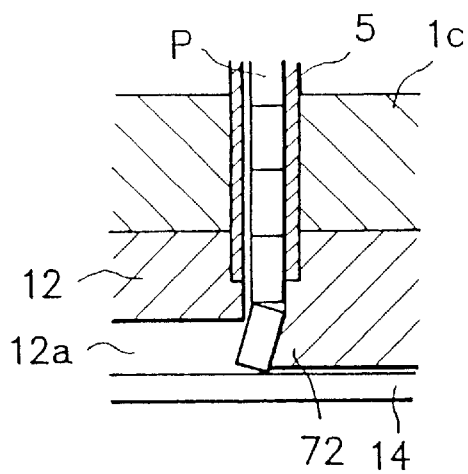
Figure 17C:
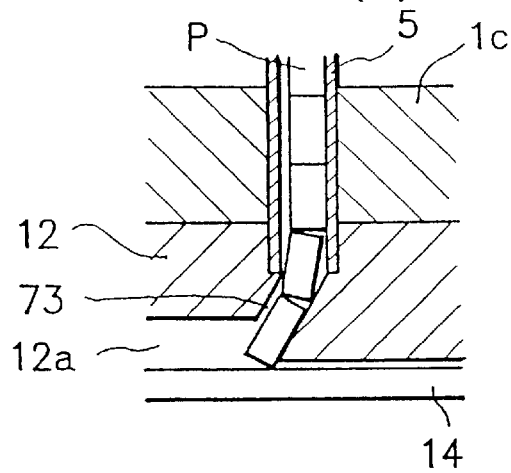
Figure 17D:
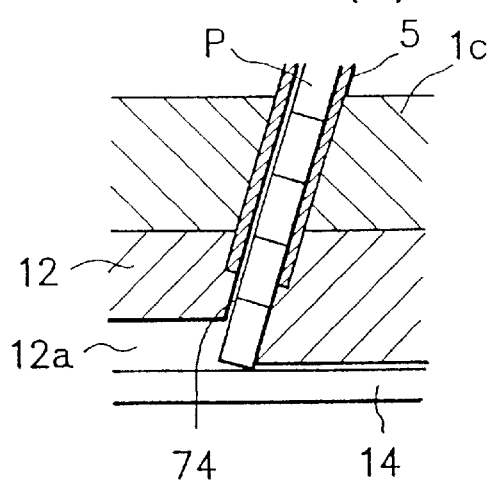
Figure 17E:
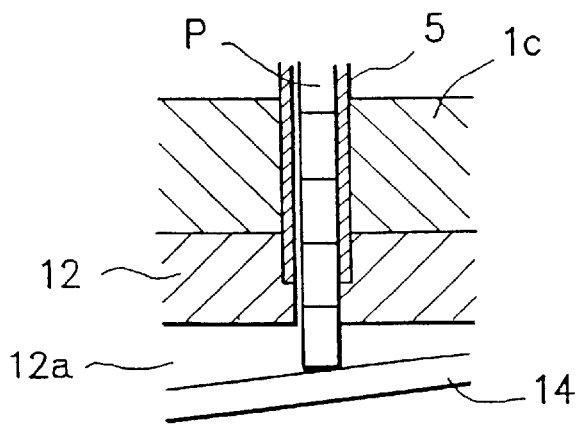
Figure 18A:
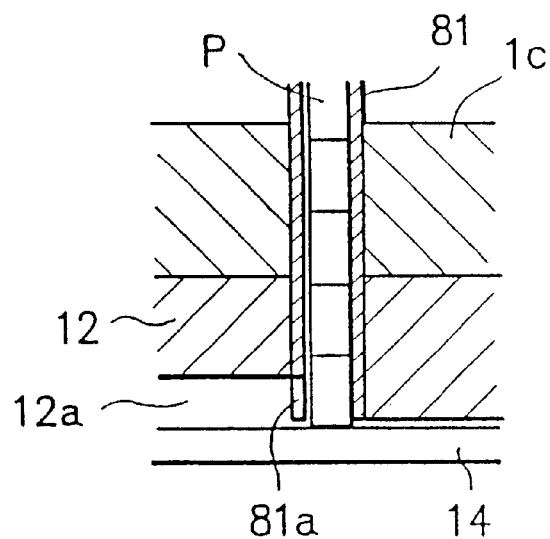
FIGS. 18(a) and (b) are cross-sectional view and a perspective view showing a choice of the shape of the stationary pipe and FIGS. 18(c) and (d) are cross-sectional views showing some other choices of the shape of the stationary pipe.
Figure 18B:
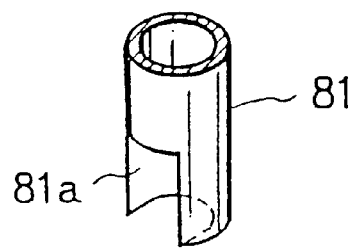
Figure 18C:
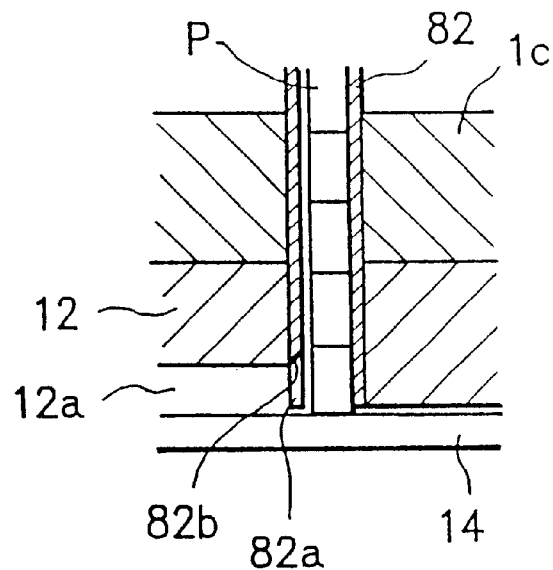
Figure 18D:
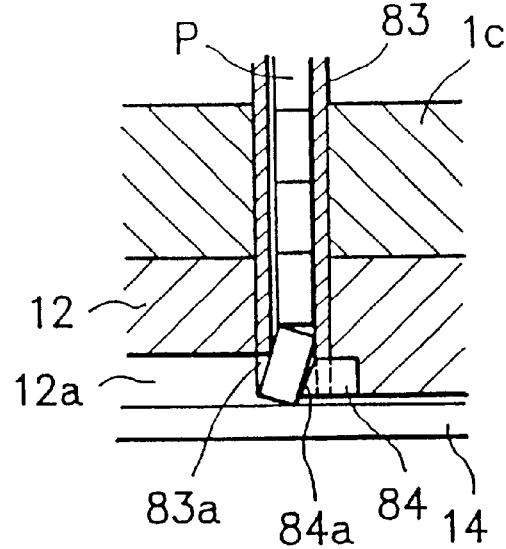
Figure 19A:
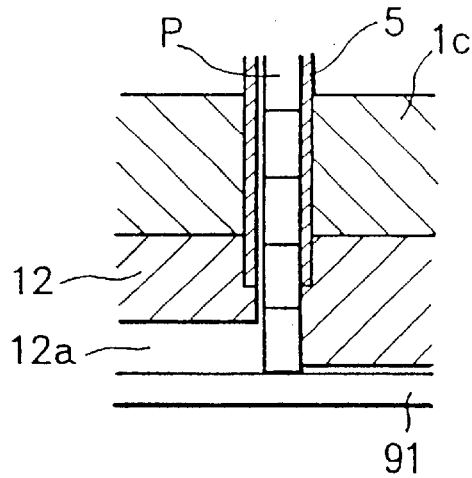
FIGS. 19(a) through (e) are cross-sectional views showing different choices of the shape of the conveying belt.
Figure 19B:
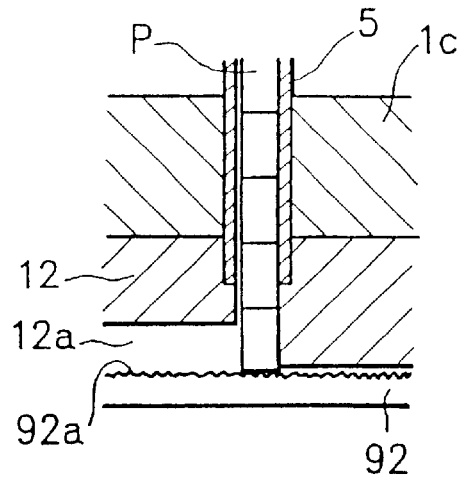
Figure 19C:
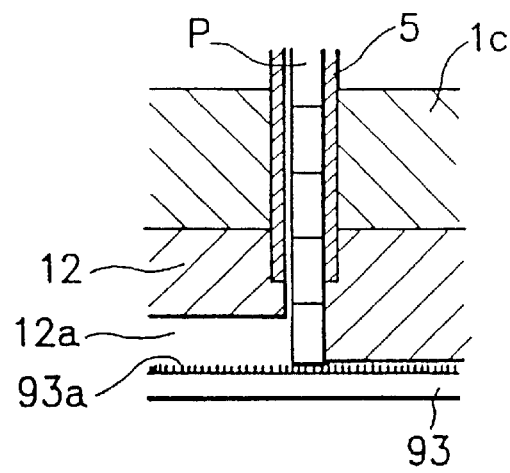
Figure 19D:
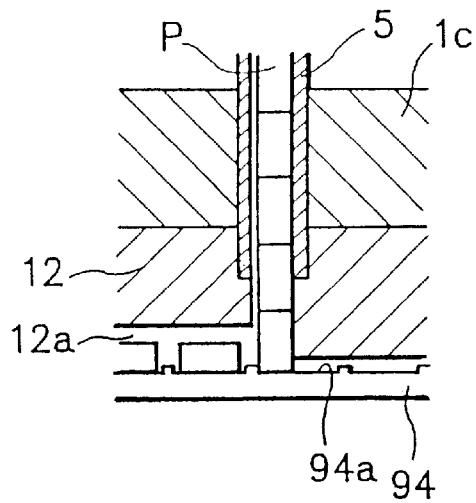
Figure 19E:
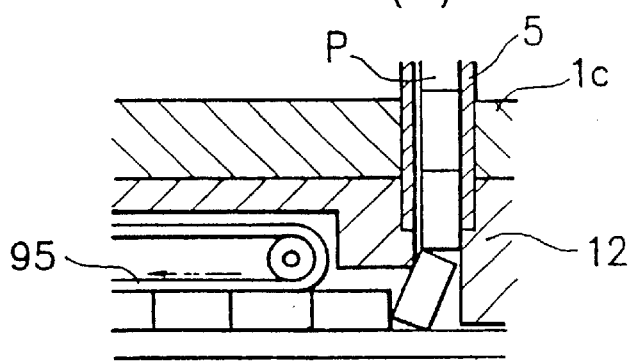

FIG. 15 shows another choice of the stationary pipe, more specifically, a stationary pipe of a structure wherewith a permanent magnet is being provided outside said stationary pipe. Namely, behind the bottom section of said stationary pipe 5 being inserted and attached to the holder plate 1c and the chip part guide 12, a permanent magnet 61 of a lengthy shape reaching the stretch of multiple number of chip parts is being installed with one side each of its North-pole and South-pole facing the stationary pipe 5 and its highest magnetic field is in alignment with the axis of said stationary pipe 3.

With a stationary pipe of this structure, among chip parts being transferred inside said stationary pipe 5, plural number of them which are being covered by the magnetic force of said permanent magnet 61, means plural number of chip parts just before being discharged onto the belt 14, can be attracted toward the inner wall of said pipe by a level of attractive force which does not impede descends of these chip parts. As shown in FIGS. 16 (*a*), (*b*) and (*c*), with chip parts of cylindrical shape P1, those of flat rectangular prism shape P3 or those of square prism shape P2, although their directions and positions may be disturbed while being transferred inside cylindrical bore of said stationary pipe 5 as shown by broken lines in these drawings, when said permanent magnet 61 is provided behind said stationary pipe 5, their directions and positions can be aligned by attraction of the magnetic force, thus allowing smooth transfer of chip parts inside said stationary pipe 5 and satisfactory discharge onto said belt 14 of the chip parts. Also, by use of a stationary pipe 5 of this structure, intake into a stationary pipe 5 with a cylindrical bore of square prism shape chip parts P2 or flat rectangular prism shape chip parts P3 and discharge thereof onto the belt 14 can be carried out satisfactorily without use of a special direction alignment means such as shown in FIGS. 12 (*e*), (*f*), (*g*) and (*h*).

Said permanent magnet can be of a shape exactly matching the external shape of said stationary pipe 5 as shown in FIG. 16 (*d*) (as is coded 62) or said magnet can be applied to a stationary pipe with a rectangular cross-section. Meanwhile, it is also possible to provide similar positional corrections to the aforesaid structure by forming multiple air suction ports in said stationary pipe 5 and by applying negative pressure externally to these air suction ports.

FIGS. 17 (*a*) through (*e*) show other choices of chip part discharge sections. The chip part discharge section shown in FIG. 17 (*a*) is provided with a corner chamfering 71 at the front corner being formed by the guide groove 12a of the chip part guide 12 and the discharge channel. The chip part discharge section shown in FIG. 17 (*b*) is provided with an inclined plane 72 behind the corner between said guide groove 12a of said chip part guide 12 and the discharge channel. The chip part discharge section shown in FIG. 17 (*c*) is being structured to carry an inclined portion 73 at about 30 degrees in the lower part of the discharge channel (the low end part of the discharge channel). The chip part discharge section shown in FIG. 17 (*d*) is being so structured that the section below the stationary pipe 5 is inclined at an angle of about 30 degrees and said stationary pipe 5 also is inclined at the same angle. The chip part discharge section shown in FIG. 17 (*e*) is being structured to carry a conveying belt 14 being inclined slightly downward toward the front direction from the normal direction perpendicular to the direction of the stationary pipe 5.

With a chip part discharge section of a structure according to FIG. 17 (*a*), the corner chamfering 71 eliminates possibility of harming the chip parts by rubbing or catching thereof by the sharp corner before making the chamfering, thus allowing smooth discharge of the chip parts onto the belt 14. With a chip part discharge section of a structure according to FIG. 17 (*b*), the direction of the low end chip part can be altered toward the lying position before being discharged onto the belt 14, thus allowing smooth discharge of the chip parts onto said belt 14. With a chip part discharge section of a structure according to FIGS. 17 (*c*), (*d*) or (*e*), as well, the direction of the low end chip part can be altered toward the lying position before being discharged onto the belt 14, thus allowing smooth discharge of the chip parts onto said belt 14.

FIG. 18 (*a*), (*c*) and (*d*) show some other choices of the stationary pipe, respectively. The stationary pipe 81 shown in FIG. 18 (*a*) is being so structured that the stationary pipe 81 extends all the way to the bottom of the chip part guide 12 and the front side of the bottom end thereof being opened into the guide groove 12a, said opening 81a (See FIG. 18 (*b*)) allowing passage of the chip parts P. The stationary pipe 82 shown in FIG. 18 (*c*) is being so structured that the stationary pipe 82 extends all the way to the bottom of the chip part guide 12 and the front side of the bottom end thereof being opened into the guide groove 12a, said opening 82a allowing passage of the chip parts P and the upper edge corner of said opening 82a being chamfered. The stationary pipe 83 shown in FIG. 18 (*d*) is being so structured that the stationary pipe 83 extends all the way to the bottom of the chip part guide 12 and the front side of the bottom end thereof being opened into the guide groove 12a, said opening 83a allowing passage of the chip parts P and a direction changing piece 84 carrying an inclined surface on its front plane being installed at the low end behind said stationary pipe 83.

With a stationary pipe of a structure according to FIG. 18 (*c*), the corner chamfering 82b eliminates the possibility of harming the chip parts by rubbing or catching thereof by the sharp corner before making the chamfering, thus allowing smooth discharge of chip parts P onto the belt 14. With a stationary pipe of a structure according to FIG. 18 (*d*), the direction of the low end chip part P can be altered toward the lying position by the direction changing piece before being discharged onto the belt 14, thus allowing smooth discharge of chip parts P onto said belt 14.

FIGS. 19 (*a*) through (*e*) show other choices of the belt. The belt 91 shown in FIG. 19 (*a*) is being equipped with magnetic force which works to attract the chip parts P. Methods to equip said belt 91 with said magnetic force can include forcefully magnetizing the belt material containing magnetic metal powder in the direction whereby necessary polarity appears on the front side thereof and forcefully magnetizing the magnetic metal film or magnetic tape being adhered on the top or bottom surface of the belt material or being inlaid inside said belt material. With a belt 91 of such a structure, chip parts P being discharged onto said belt 91 can be attracted to sustain on the belt surface by the magnetic force to prevent unnecessary slippage of chip parts P on the surface of said belt 91, thus allowing secure conveyance of chip parts P on said belt 91.

The belt 92 shown in FIG. 19 (*b*) is being equipped with a coarse surface 92a on its front side, while the belt 93 shown in FIG. 19 (*c*) is being equipped with short flocked fabrics 93a. With a belt 92 or 93 of these structures, said coarse surface 92a or fabric flocks 93a provide appropriate contact resistance to the chip parts being discharged thereon, by their surface coarseness, to prevent unnecessary slippage of chip parts P on the surface of said belt 92 or 93, thus allowing secure conveyance of chip parts P on said belt 92 or 93.

The belt 94 shown in FIG. 19 (*d*) is being provided with dents 94a which can retain the chip parts P in the longitudinal direction along the longitude of the upper surface thereof at intervals corresponding to the belt feeding pitch. With a belt 94 of this structure, chip parts P being discharged onto said belt 94 can be retained successively in respective dents 94a and similar function and effects to the aforesaid belts can be expected.

The belt system shown in FIG. 19 (e) is being equipped with an auxiliary belt 95 being positioned horizontally above its main belt 14, said auxiliary belt 95 being so interlocked with the main belt 14 to move forward at the same pitch. With a belt system of this structure, chip parts can be conveyed being sustained between the facing surfaces of the two belts, thus eliminating unnecessary slippage by depression of the auxiliary belt 95 on the chip parts to the surface of the main belt 14.

Figure 20:
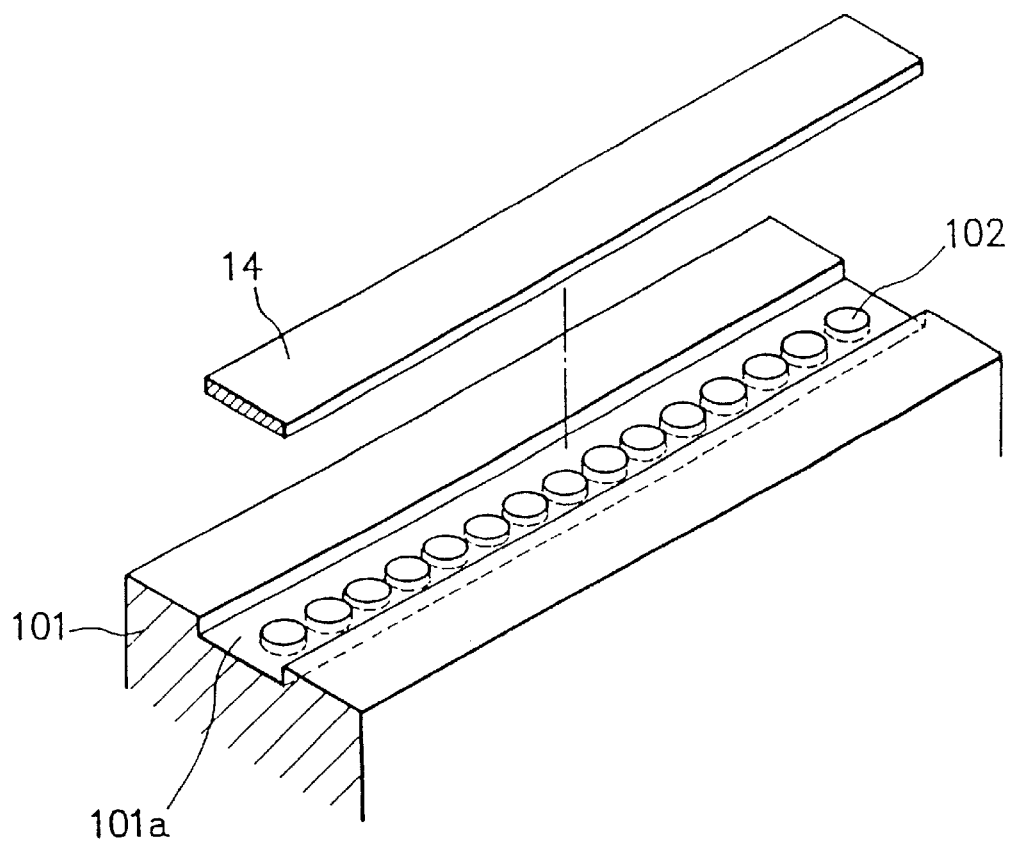
FIG. 20 is a perspective view showing a choice of the shape of the belt guide.
Figure 21A:
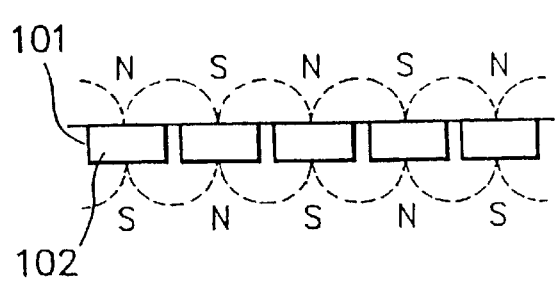
FIGS. 21(a) and (b) indicate the polarity of the magnets being shown in FIG. 20.
Figure 21B:
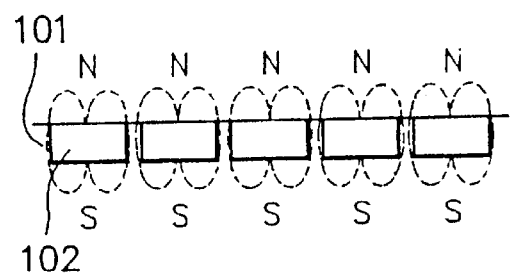

FIG. 20 shows another choice of the belt guide. The belt guide 101 shown in FIG. 20 carries multiple number of permanent magnets 102 inlaid at equal intervals longitudinally flush in the bottom surface of its guide groove 101a. The upper surface of respective permanent magnets 102 is being positioned level with the bottom surface of the guide groove 101a and the bottom surface of the conveying belt 14 is being suspended in contact with or separate from said bottom surface of said guide groove 101a inlaid with said permanent magnets 102. These magnets attract the chip parts P being conveyed on said belt 14 downward by their magnetic force to prevent unnecessary slippage of chip parts on said belt, each permanent magnet 102 being so directed that either of its North-pole or South-pole is facing the bottom surface of said belt 14 and its highest magnetic field being in alignment with the longitudinal center of said guide groove 101a. The choice of the polarity for the upper face of respective permanent magnet 102 can be the alternate sequence of the North-pole and South pole according to FIG. 21 (a) or a continuation of either the North-pole or the South-pole according to FIG. 21 (b). With the latter polarity sequence choice, it is more preferable to set the interval as short as possible so that the attraction of the magnetic force may continue linearly.

Meanwhile, when a belt possessing magnetism namely, a belt being made of a material containing magnetic metal powder, is used for the structure being referred to in the preceding paragraph, said belt gets attracted toward the bottom surface of the guide groove thus eliminating unnecessary clearance between said belt and said bottom surface of the guide groove, or, instead, said belt itself may be magnetized to carry similar polarity to the aforesaid magnet group to sustain chip parts having been discharged on said belt by attraction of its own magnetic force.

It is also possible to acquire similar sustaining effect to the belt being referred to in the preceding paragraph by using a belt being made of a porous and air permeable material and by providing air suction ports rather than said magnet group below said belt before applying negative pressure to said air suction ports externally.

Figure 22A:
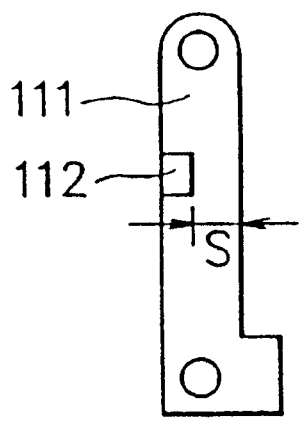
FIG. 22(a) is a top view showing a choice of the shape of the stopper and FIGS. 22(b) and (c) are partly cutout top views of some other choices of the shape of the stopper.
Figure 22B:
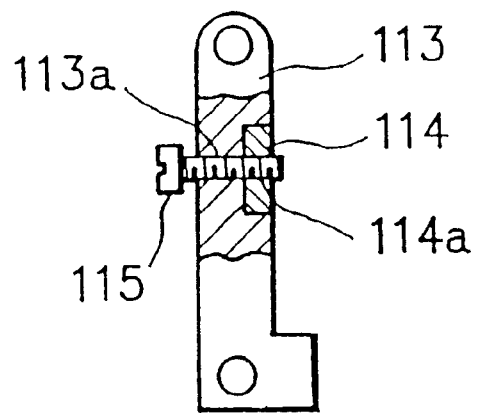
Figure 22C:
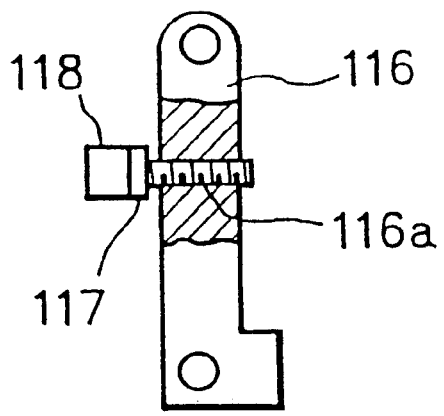

FIGS. 22 (a) through (c) show other choices of the stopper. The stopper 111 shown in FIG. 22 (a) is being equipped with a permanent magnet 112 implanted flush in the surface opposite to the surface facing the chip part guide, but at the position corresponding to the front end of the guide groove. With a stopper of this structure, since the chip parts do not contact said permanent magnet directly, possibility of chipping off or abrasion with the chip parts can be eliminated while, at the same time, prolonging the service life of said permanent magnet and, moreover, it is also possible to regulate the magnetic attraction force by adjusting the distance S between said permanent magnet 112 and the attracting plane.

The stopper 113 shown in FIG. 22 (b) is being equipped with a permanent magnet 114 implanted flush in the surface facing the chip part guide at the position aligning to the front end of the guide groove and with a screw 115 threading through the threaded holes 113a and 114a provided through said stopper 113 and said magnet 114, said threaded holes being in alignment of the center of said permanent magnet 114. With a stopper of this structure, stopping position of the forefront chip part can be fine-adjusted by changing the projection beyond said permanent magnet 114 of said screw 115 and, also, the tip end of said screw 115 having been magnetized by said permanent magnet 114 works to attract the forefront chip part in itself.

The stopper 116 shown in FIG. 22 (c) is being equipped with a screw 117 threading through the threaded hole 116a being positioned in alignment with the center of the guide groove of the chip part guide and, at the same time, a permanent magnet 118 is being attached securely onto the head of said screw 117. With a stopper of this structure, stopping position of the forefront chip part can be fine-adjusted by changing the projection beyond said permanent magnet 118 of said screw 117 and, also, the tip end of said screw 117 having been magnetized by said permanent magnet 118 works to attract the forefront chip part in itself.

Meanwhile, when the aforesaid screws 115 or 117 is of a substance which can be provided with permanent magnetism, the forefront chip can be attracted by the tip end of said screw 115 or 117 omitting installation of said permanent magnet 114 or 118.

Figure 23:
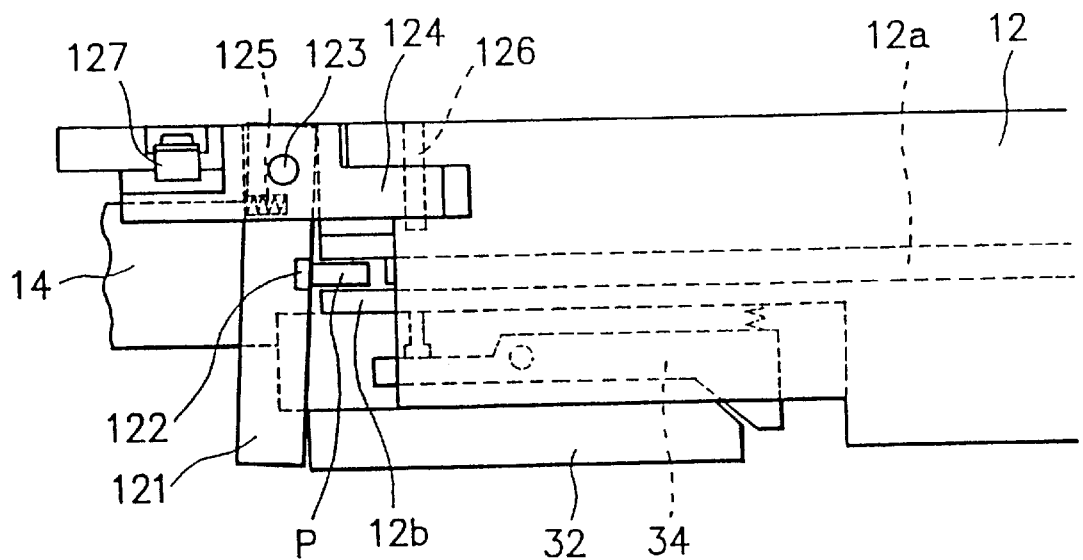
FIG. 23 is a top view of a choice of the structure of the stopper section.
Figure 24:
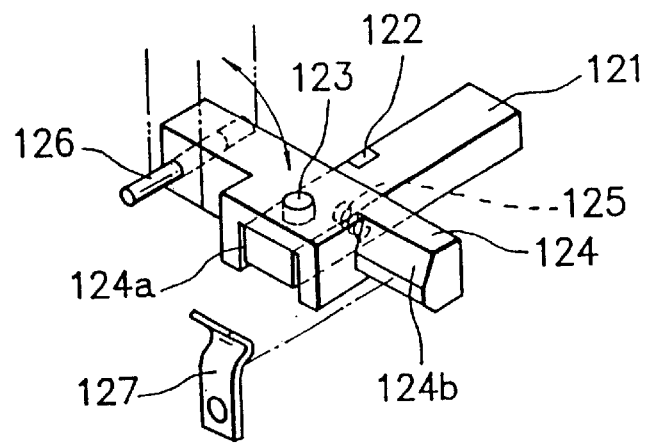
FIG. 24 is a perspective view of the stopper, stopper holder and flat spring as are shown in FIG. 23.

FIG. 23 shows another choice of the stopper. As also shown in FIG. 24, this topper 121 is being equipped with a permanent magnet 122 implanted flush in its side surface facing the chip part guide 12, one end of said stopper 121 being pinned down into a dent 124a provided in the center of a stopper holder 124 for free pivoting by a pin 123 and said stopper 121 being activated by a coil spring 125 in the counter-clockwise direction in FIG. 23. Said stopper holder 124 is being pinned down to the front end of the chip part guide 1 for free pivoting by a pin 126, said stopper holder 125 being allowed of vertical turns around said pin 126. Also, at the other end of said stopper holder 124, a projection carrying inclined surfaces on the upper and lower sides thereof is being formed, said projection 124 engaging with a plate spring 127 being attached to the front end of the chip part guide 12 for free engagement and disengagement and said stopper holder 124 and said stopper 121 coming to the horizontal position when said projection 124 is in engagement with said plate spring 127.

With a stopper of this structure, by lifting the projection side of said stopper holder 124 resisting the engaging force of said plate spring 127 to let said stopper holder 124 and said stopper 121 pivot upward, multiple number of chip parts P remaining inside the guide groove 12a of the chip part guide 12 can be discharged through the front end of said guide groove 12a to drop by their own weight. Meanwhile, the action of the stopper 121 for stopping and separating the forefront chip part is the same as that of the stopper according to FIG. 1.

Figure 25A:
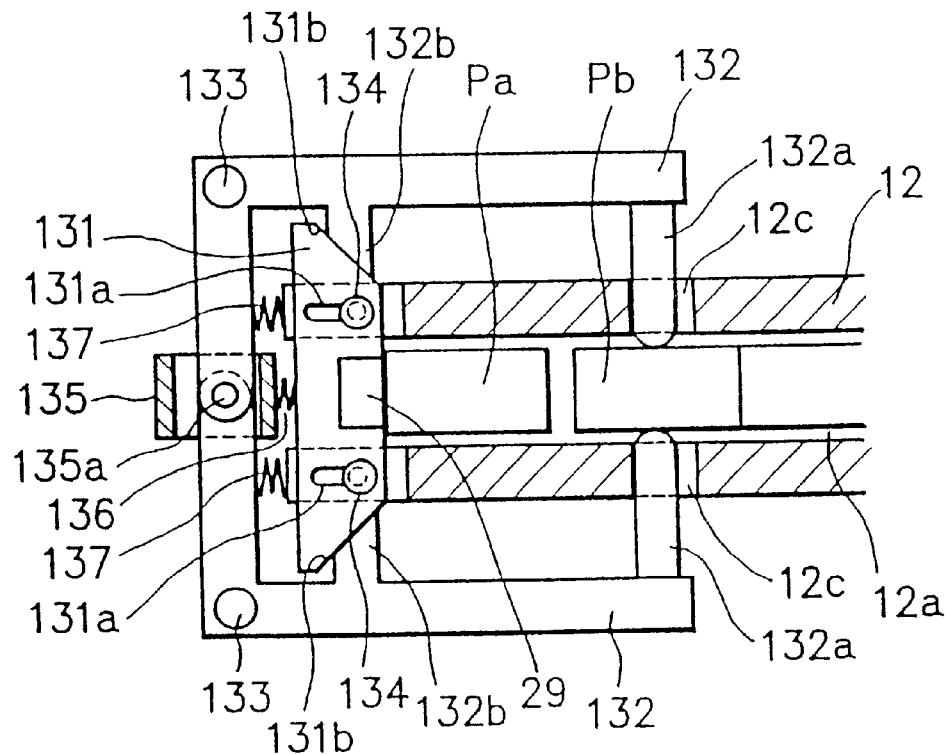
FIG. 25(a) is a top view showing a choice of the structure of the stopper releasing mechanism and FIG. 25(b) is an explanatory drawing indicating movement thereof.
Figure 25B:
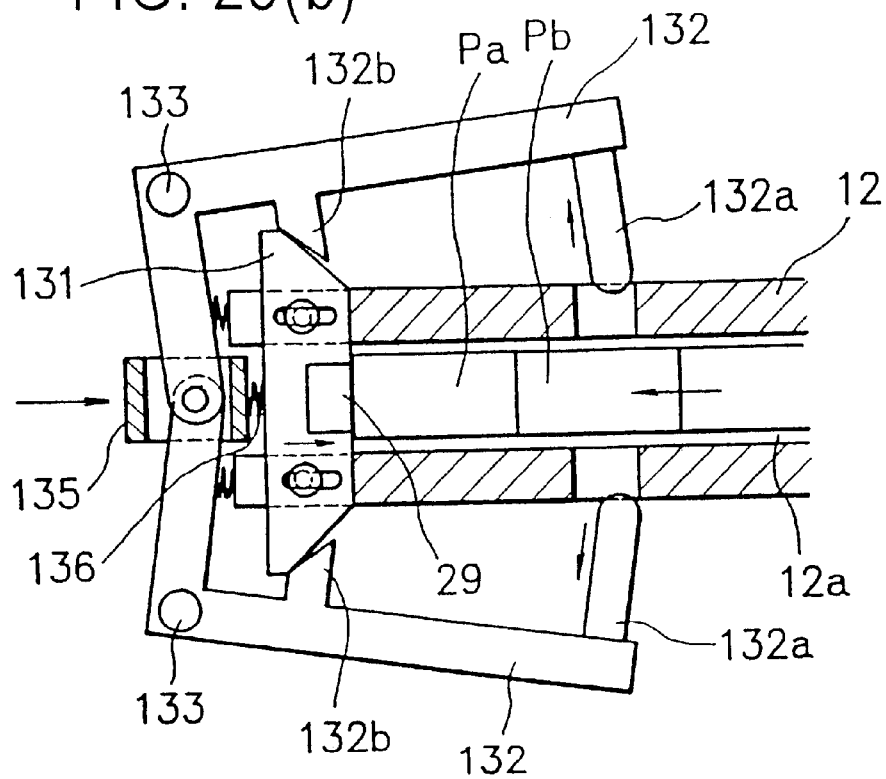

FIG. 25 (a) shows another choice of the stopper release mechanism. With this mechanism, a stopper 131 being equipped with a permanent magnet 29 is being positioned for free movement forward and backward facing the front end of the chip part guide 12 and on both sides of said stopper 131, a pair of chip part holder arms 132 are being pinned down by holder pins 133 for free swiveling, respectively, around said holder pins 133.

Said stopper 131 is provided with two slots 131a being directed in the axial direction of the chip part flow, the moving direction thereof being limited by respective pins 134 being installed into the chip part guide 12 and both ends of said stopper being formed into inclined planes 131b. Said pair of the chip part holder arms 132 are provided with a chip part holder pin 132a at their ends, respectively, said chip part holder pins 132a, respectively, are being inserted through holes 12c opened on the side wall in front section of the chip part guide 12 into the guide groove 12a and said pair of chip part holder arm being also provided with projections 132b carrying inclined planes, respectively, at their middle point. Also, said pair of chip part holder arms 132 are being pinned down to a push-piece 135 by a pin 135a at the other ends thereof. Moreover, the first coil spring 136 is being inserted between said push-piece 135 and said stopper 131 and a pair of second coil springs 137 are being inserted between respective chip part holder arms 132 and the chip part guide 12.

Under the status according to FIG. 25 (a) wherewith the forward depressing force from behind is not being applied, said pair of chip part holder arms 132 are in closed state toward respective inside by activation of said second coil springs 137 and respective chip part holder pins 132a being inserted into the guide groove 12a pushing the next chip part Pb to sustain at its current position. Also, said projections 132b of said pair of chip part holder arms 132 depress the inclined planes 131b on both sides of said stopper 131 to push said stopper 131 forward to open the front end of the guide groove 12a and the forefront chip part Pa moves forward together with said stopper 131 being attracted by the permanent magnet 28?, thus totally separating from the next chip part Pb.

When the push-piece 135 is pushed by a separate drive means after the forefront chip part Pa has been picked up by a suction head or the sort, as shown in FIG. 25 (b), said pair of chip part holder arms 132 open apart pivoting around their holder pins 133 to move respective chip part holder pins 132a apart outward to release the next chip part Pb and, at the same time, depression by respective projections 132b onto the stopper is released before said stopper 131 moves back to contact the front end of the guide groove 12a by activation of the first coil spring 136. Although having been omitted from the drawing, the belt is fed only after said stopper 131 contacts the front end of said guide groove 12a, thereby chip parts on the belt travel forward together with the belt feed until they stop when the forefront chip part Pa hits the permanent magnet 29 being implanted in said stopper 131.

With a stopper release mechanism of this structure, when chip parts on the belt are fed forward together with said belt, the stopper 131 moves to contact the front end of the guide groove 12a to stop the forefront chip part Pa at a prescribed position and, at the same time, when the forefront part Pa hits the stopper 131 to stop movement of the remaining chip parts, the next chip part Pb is sustained at its current position before said stopper 131 opens to draw the forefront part Pa attracting by the permanent magnet 29 being implanted into said stopper 131 to separate totally from the next chip part and, consequently, the forefront chip part Pa can be separated from the next chip part Pb and brought to an independent state without fail even when the forefront chip part and the next chip part are being stuck by environmental moisture or by influence of the treatment liquid or the sort having been used during production processes of said chip parts or when the next chip part Pb is being caught by the forefront chip part Pa by their surface coarseness, thus eliminating such troubles as dragging of the next chip part Pb together with the forefront one or disturbance of the alignment and positioning of the succeeding chip parts, thus flowing secure and smooth pickup by an suction head, etc. of the forefront chip part.

Figure 26:
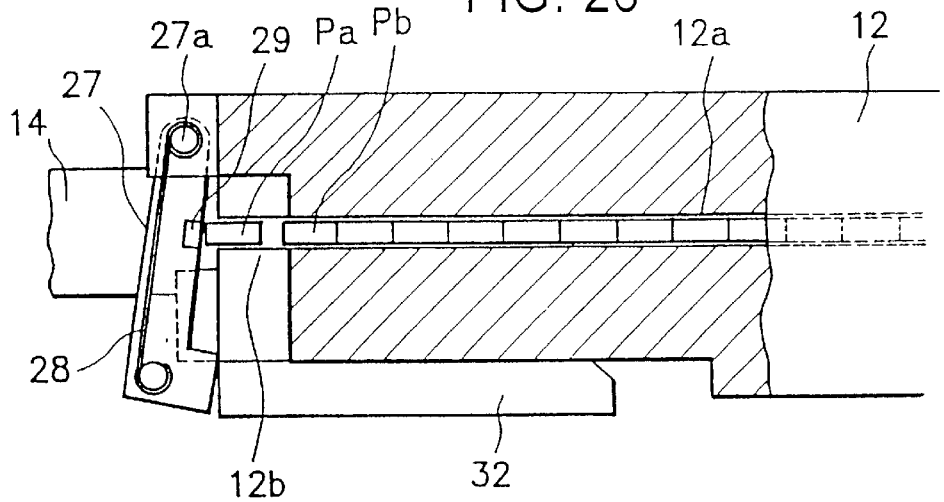
FIG. 26 is a top view showing another choice of the structure of the stopper releasing mechanism.
Figure 27A:
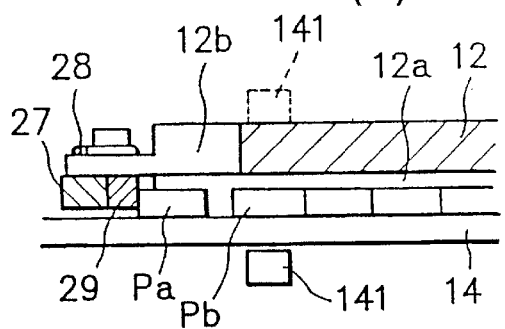
FIGS. 27(a) through (d) are cross-sectional views showing different choices of the structures of the second chip part holder.
Figure 27B:
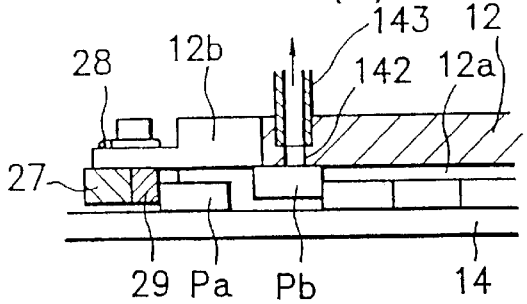
Figure 27C:
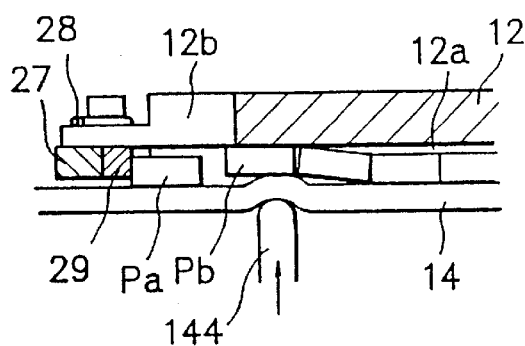
Figure 27D:
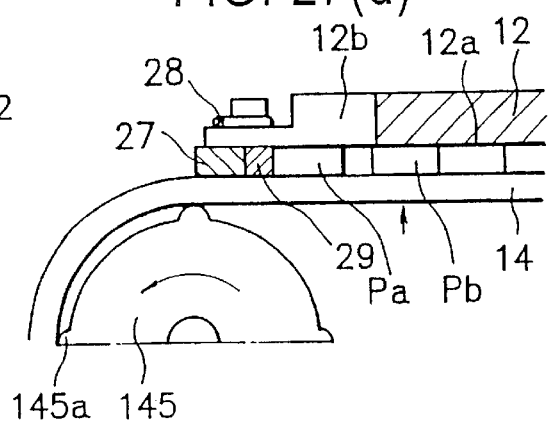

FIG. 26 shows some other stopper release mechanism. As is evident in comparison with the stopper release mechanism according to FIG. 7 (b), this stopper release mechanism omits the means to sustain the next chip part Pb when releasing its stopper. When there exists appropriate friction resistance between the upper surface of the belt 14 and chip parts on said belt 14, even when the next chip part sustaining mechanism, it is possible to separate the forefront chip part Pa from the next chip part Pb by merely moving said forefront chip part Pa being attracted onto the permanent magnet 29 being implanted into the stopper 27 together with the opening movement of said stopper.

FIGS. 27 (a) through (d) shows other choices of the next chip part sustaining mechanism. The next chip part sustaining mechanism according to FIG. 27 (a) is being equipped with a permanent magnet 141 below the belt 14 or above the chip part guide 12 at the point corresponding to the position the next chip part Pb comes to a stop. With a next chip part sustaining mechanism of this structure, the next chip part Pb is being sustained by attraction of the permanent magnet 141 toward the belt side or toward the chip part guide side.

The next chip part sustaining mechanism according to FIG. 27 (b) is being provided with an air suction port 142 through the ceiling or through the side wall of the chip part guide 12 at the point corresponding to the position where the next chip part Pb comes to a stop. With a next chip part sustaining mechanism of this structure, by application of negative pressure through said air suction port 142 via an air pipe, the next chip part Pb can be sustained by sucking it onto said air suction port 142. Also, if a belt being made of a porous material with an appropriate air permeability is used, said air suction port 142 and air pipe 143 can be installed below said belt.

The next chip part sustaining mechanism according to FIG. 27 (c) is being equipped with a pressure pin 144 at a position below the belt 14 corresponding to the point where the next chip part Pb comes to a stop. With a next chip part sustaining mechanism of this structure, by pushing up said pressure pin 144 to deform said belt 14 by its tip end, the next chip part Pb can be sustained by depressing it onto the ceiling of the guide groove 12a.

The next chip part sustaining mechanism according to FIG. 27 (d) employs a front side pulley 145 being equipped with projections 145a at, for example, 90° intervals. With a next chip part sustaining mechanism of this structure, when one of the projections 145a comes at the top end point, said projection 145a pushes up the belt 14 to deform said belt 14 at said point which works to sustain the next chip part Pb by depressing it onto the ceiling of the guide groove 12a.

Figure 28A:
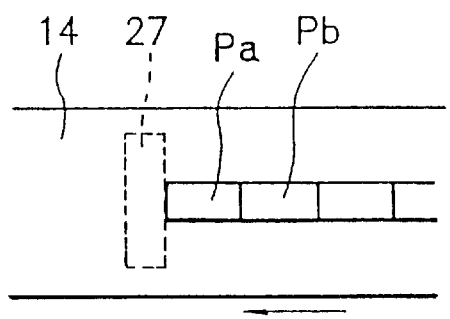
FIGS. 28(a) and (b) are type drawings showing another method for separation of the forefront chip part.
Figure 28B:
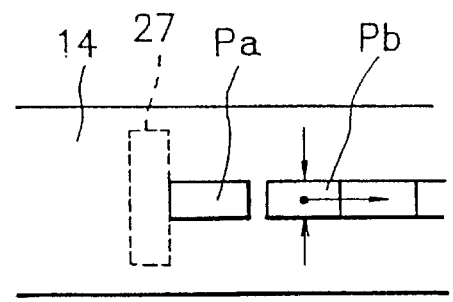
Figure 29A:
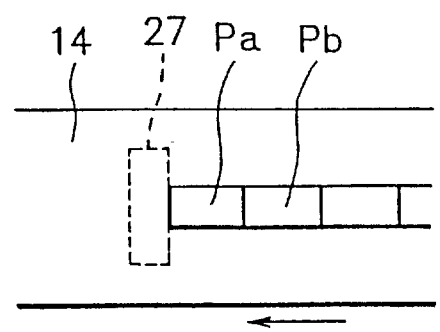
FIGS. 29(a) and (b) are type drawings showing some other method for separation of the forefront chip part.
Figure 29B:
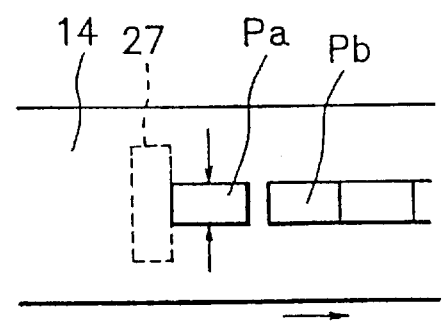

FIGS. 28 (a) and (b) and FIGS. 29 (a) and (b) show some other choices of the method to separate the forefront chip part to FIG. 28, when the forefront chip part Pa comes to a stop hitting the stopper 27 by the feed of the belt 14 (See FIG. 28 (a)), the next chip part gets caught by an appropriate means before being pushed back together with all the succeeding chip parts to slide behind on said belt 14 (See FIG. 28 (b)), thus separating the forefront chip part Pa from the next chip part Pb. With the method according to FIG. 29, when the forefront chip part Pa comes to a stop hitting the stopper 27 by the feed of the belt 14 (See FIG. 29 (a)), the forefront chip part Pa gets sustained by an appropriate means before moving back the belt 14 by a prescribed pitch to move back the next chip part Pb together with all the succeeding chip parts (See FIG. 29 (b)), thus separating the forefront chip part Pa from the next chip part Pb.

Figure 30:
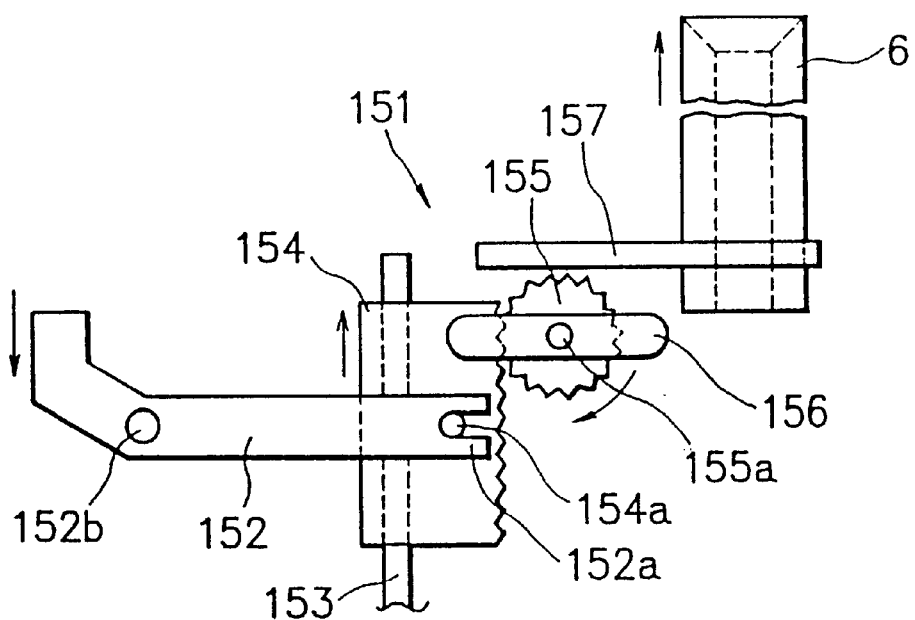
FIG. 30 is a schematic drawing showing a choice of the structure of the pipe raising and lowering mechanism.

FIG. 30 shows another choice of the pipe up-and-down drive mechanism. This pipe up-and-down drive mechanism 151 comprises a drive lever 152 being pinned down onto the side of the base frame for free turns by a pin 152b which carries a U-shaped tip end 152a at one end thereof, a guide rod 153, a rack 154 with a pin 154a installed into its side engaging with the U-shaped tip end 152a of said drive lever 152, said rack 154 being suspended by said guide rod 153 for free vertical movement, a pinion 155 being installed to the side of the base frame for free rotation by a pin 155a, a cam 156 being integrally attached to said pinion 155 and a trailer lever 157 one end thereof being attached to the moving pipe 6 and the other end thereof being positioned just above the position of said cam 156.

With a pipe up-and-down drive mechanism 151 of this structure, by pressing down one end of the drive lever 152 to raise the rack 154, said rack 154 works to turn the pinion 155 together with the cam 156 clockwise in the drawing, which in turn brings up the trailer lever 157 by each half-rotation of said pinion 155 by the function of said cam 156 being integrally attached thereto, thus moving up the moving pipe. Since this mechanism is being capable of moving the pipe up and down for plural number of times by a single stroke of the drive lever operation, higher probability of intaking the chip parts into the stationary pipe can be expected as compared with other mechanisms wherewith a single lever operation works to move up and down the moving pipe 6 just for a cycle.

Figure 31:
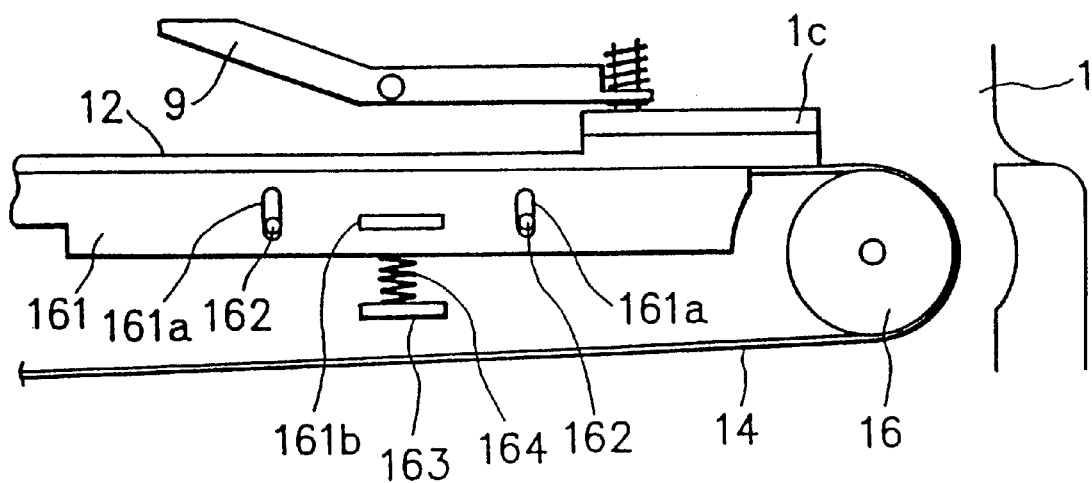
FIG. 31 is a side view showing a choice of the structure of the chip part switchover mechanism.

FIG. 31 shows another choice of the chip part type switching over mechanism. With this chip part type switching over mechanism, slots 161a are being opened in the belt guide 161, said slots 161a engaging with pins 162 installed into the side of the base frame 1 to mount said belt guide 161 to the base frame 1 for free vertical movement within the range of the slots 161a and said belt guide 161 being activated upward by a coil spring 164 being inserted between said belt guide 161 and a support plate 163 being installed to the side of the base frame 1, said belt guide 161 thus being depressed onto the bottom of the chip part guide 12.

With a chip part type switching over mechanism of this structure, by pressing down the operating rib 161b being installed to the side of said belt guide 161 by fingers to lower said belt guide 161 against activation of the coil spring 164 and by pushing down the belt by other fingers to let it slack down while keeping said belt guide 161 at its lower stroke end, all the chip parts remaining on the belt 14 can be taken out through a space thus occurring between said belt 14 and the chip part guide 12.

Meanwhile, it is also effective to design the rear side pulley 16 movable in vertical direction, to move it down together with the belt guide 161 to cause the space necessary to take out the remaining chip parts. Also, when the rear side pulley is provided with a handle whereby said pulley and the belt may be turned backward manually, all the chip parts remaining on the belt can be cleared out in line.

Figure 32:
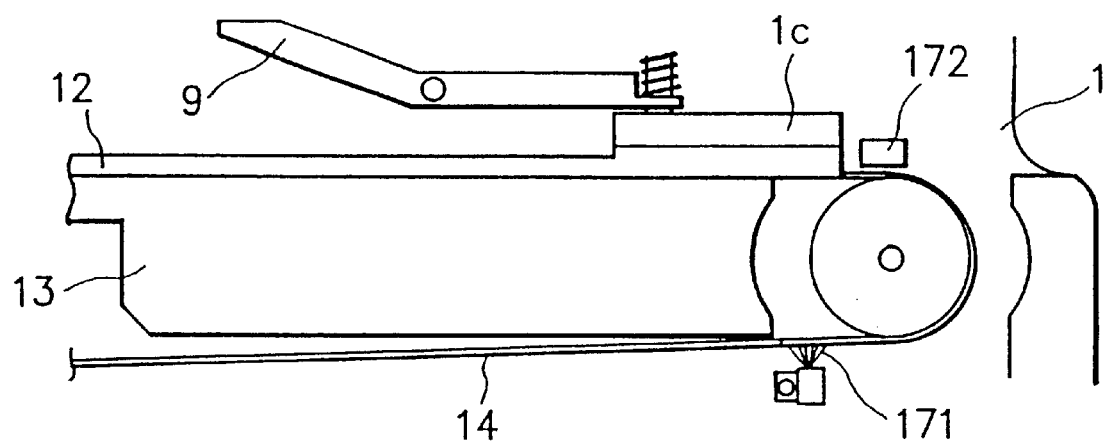
FIG. 32 is a side view showing an example of a structure effective for removal of contaminants and metal powder adhering on the belt surface.

FIG. 32 shows a means effective for removal of contaminants and metal chips from the belt surface. The numeral 171 stands for a brush contacting surface of the belt 14 by its brush ends and numeral 172 stands for a permanent magnet positioned just above the belt not being in direct contact with the surface of said belt 14. With a means of this structure, contaminants adhering or accumulating on the belt surface can be brushed off by said brush 171, while metal chips adhering on said belt 14 can be attracted away by said permanent magnet 172.

Meanwhile, when using a belt made of a material tending to be charged statistically, use of a brush being made of electrically conductive substances such as metal and grounding said brush will work to efficiently remove the charged static electricity.

Figure 33:
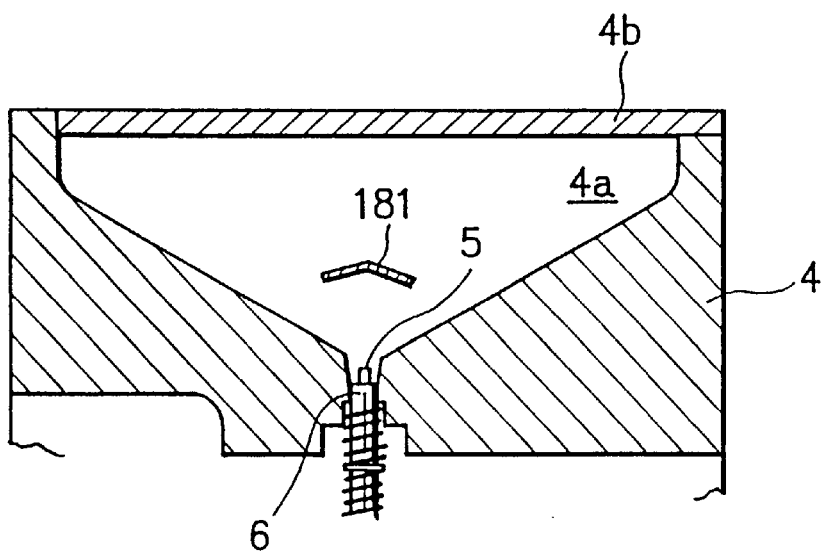
FIG. 33 is a side view showing an example of a structure effective for reduction of the load of parts being applied to the stationary pipe.

FIG. 33 shows a means effective for reducing the chip part load being applied to the stationary pipe, etc. With this means, an angle plate 181 is being installed in the storage chamber 4a of the hopper 4. This structure is effective to reduce the chip part load being applied onto the stationary pipe 5 and moving pipe 6 being positioned below said angle plate 181 which bears a portion of the load of stored chip parts, thus working to avoid concentration of the load of all the stored chip parts onto said two type of pipes.

Although drawings shall be omitted, when supplying large quantity of chip parts continuously, it should be effective to install a sensor to detect the remainder of the stored chip parts in the hopper (remaining chip part level) such as an optical switch in the hopper to so arrange that necessary chip parts be fed into said hopper from a separate large-size chip-part refilling hopper using a conveyance means such as a belt conveyor when said sensor detects consumption of the chip parts beyond a prescribed level.

What is claimed is:

1. An electronic component supplying apparatus, comprising:
    a storage chamber for storing electronic components in random directions;
    a vertical discharge channel for moving downward the electronic components taken into from the storage chamber in a predetermined direction;
    a lateral conveying channel for moving sideward the electronic components discharged from the vertical discharge channel in a ranging condition;
    a stopper for stopping a movement of a range of the electronic components conveyed by the lateral conveying channel; and
    a holder for sustaining at least a second electronic component of the electronic components posterior to a forefront electronic component at a stopped position,
    wherein the holder includes a permanent magnet for attracting the at least the second electronic component of the electronic components posterior to the forefront electronic component.

2. The apparatus according to claim 1, wherein the holder includes a pin for pushing the at least second electronic component of the electronic components posterior to the forefront electronic component.

3. The apparatus according to claim 1, wherein the holder includes an air suction port for sucking the at least second electronic component of the electronic components posterior to the forefront electronic component.

4. The apparatus according to claim 1, further comprising a driver for displacing the stopper between a component stopping position and a removed position therefrom.

5. The apparatus according to claim 4, further comprising a permanent magnet placed on the stopper for attracting a forefront electronic component to the stopper.

6. A method of supplying electronic components each having a body without leads, comprising:

moving downward the electronic components taken into from an electronic component storage chamber in a predetermined direction via a vertical discharge channel;

moving sideward the electronic components discharged from the vertical discharge channel in a ranging condition via a lateral conveying channel;

bringing a range of the electronic components in the lateral conveying channel into contact with a stopper and stopping a movement of the range of the electronic components; and sustaining at least a second electronic component of the electronic components posterior to a forefront electronic component at a stopped position by a holder.

7. The method according to claim 6, wherein the holder includes a pin for pushing the at least second electronic component of electronic components posterior to the forefront electronic component.

8. The method according to claim 6, wherein the holder includes a permanent magnet for attracting the at least second electronic component of the electronic components posterior to the forefront electronic component.

9. The method according to claim 6, wherein the holder includes an air suction port for sucking the at least second electronic component of the electronic components posterior to the forefront electronic component.

10. A method of supplying electronic components each having a body without leads, comprising:

moving downward the electronic components taken into from an electronic component storage chamber in a predetermined direction via a vertical discharge channel;

moving sideward the electronic components discharged from the vertical discharge channel in a ranging condition via a lateral conveying channel;

bringing a range of the electronic components in the lateral conveying channel into contact with a stopper and stopping a movement of the range of the electronic components; and sustaining at least a second electronic component of the electronic components posterior to a forefront electronic component at a stopped position by a holder and displacing the stopper from a component stopping position to a removed position therefrom.

11. The method according to claim 10, wherein the holder includes a pin for pushing the at least the second electronic component of the electronic components posterior to the forefront electronic component.

12. The method according to claim 10, wherein the holder includes a permanent magnet for attracting the at least second electronic component of the electronic components posterior to the forefront electronic component.

13. The method according to claim 10, wherein the holder includes an air suction port for sucking the at least the second electronic component of the electronic components posterior to the forefront electronic component.

14. An electronic component supplying apparatus, comprising:

a storage chamber for storing electronic components in random directions;

a vertical discharge channel for moving downward the electronic components taken into from the storage chamber in a predetermined direction;

a lateral conveying channel for moving sideward the electronic components discharged from the vertical discharge channel in a ranging direction;

a stopper for stopping a movement of a range of the electronic components conveyed by the lateral conveying channel; and a holder for sustaining at least a second electronic component of the electronic components posterior to a forefront electronic component at a stopped position, wherein the holder includes an air suction port for sucking the at least second electronic component of the electronic components posterior to the forefront electronic component.

15. The apparatus according to claim 14, further comprising a driver for displacing the stopper between a component stopping position and a removed position therefrom.

16. An electronic component supplying apparatus, comprising:

a storage chamber for storing electronic components in random directions;

a vertical discharge channel for moving downward the electronic components taken into from the storage chamber in a predetermined direction;

a lateral conveying channel for moving sideward the electronic components discharged from the vertical discharge channel in a ranging condition;

a stopper for stopping a movement of a range of the electronic components conveyed by the lateral conveying channel;

a holder for sustaining at least a second electronic component of the electronic components posterior to a forefront electronic component at a stopped position;

a driver for displacing the stopper between a component stopping position and a removed position therefrom; and a permanent magnet placed on the stopper for attracting a forefront electronic component to the stopper.

* * * * *